(12) United States Patent
Moore et al.

(10) Patent No.: US 9,577,616 B2
(45) Date of Patent: Feb. 21, 2017

(54) LEVEL SHIFTER

(71) Applicant: ANALOG DEVICES, INC., Norwood, MA (US)

(72) Inventors: Ralph D. Moore, Greensboro, NC (US); Bryan S. Puckett, Stokesdale, NC (US); Brad P. Jeffries, Browns Summit, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/599,664

(22) Filed: Jan. 19, 2015

(65) Prior Publication Data

US 2016/0211832 A1 Jul. 21, 2016

(51) Int. Cl.
 *H03K 3/00* (2006.01)
 *H03K 3/356* (2006.01)
 *H03K 19/0185* (2006.01)

(52) U.S. Cl.
 CPC ...... *H03K 3/356104* (2013.01); *H03K 19/018521* (2013.01)

(58) Field of Classification Search
 CPC ... H03K 19/00; H03K 19/0175; H03K 19/0008; H03K 19/0013; H03K 19/0016; H03K 19/0185; H03K 19/018507; H03K 19/018514; H03K 19/018521; H03K 19/018528
 USPC ............ 326/80, 81; 327/333, 306, 291, 298
 See application file for complete search history.

(56) References Cited

U.S. PATENT DOCUMENTS

| | | | |
|---|---|---|---|
| 5,892,385 A | 4/1999 | Hashiguchi | |
| 6,563,357 B1 | 5/2003 | Hsu et al. | |
| 6,727,749 B1 * | 4/2004 | Quinn | G06G 7/14 327/124 |
| 6,838,924 B1 | 1/2005 | Davies, Jr. | |
| 6,891,916 B2 | 5/2005 | Park et al. | |
| 7,443,223 B2 | 10/2008 | Bajkowski et al. | |
| 7,525,367 B2 | 4/2009 | Behrends et al. | |
| 7,737,757 B2 | 6/2010 | Behrends et al. | |
| 7,994,843 B2 | 8/2011 | Ogawa | |
| 8,030,964 B1 | 10/2011 | Shih et al. | |
| 8,063,662 B2 | 11/2011 | Foley et al. | |
| 8,378,728 B1 | 2/2013 | Goyal et al. | |
| 8,416,006 B1 | 4/2013 | Timonen et al. | |
| 8,497,726 B2 | 7/2013 | Ryu et al. | |
| 8,686,888 B2 | 4/2014 | Chou et al. | |
| 8,742,790 B1 | 6/2014 | Roo et al. | |
| 2006/0197554 A1 | 9/2006 | Jinta | |
| 2011/0260753 A1 | 10/2011 | Srivastava et al. | |
| 2012/0112790 A1 | 5/2012 | Huang | |
| 2013/0229220 A1 | 9/2013 | Bardsley et al. | |
| 2014/0062736 A1 | 3/2014 | Nandi et al. | |
| 2014/0092656 A1 | 4/2014 | Aiura | |
| 2014/0210516 A1 | 7/2014 | Hwang et al. | |
| 2014/0250278 A1 | 9/2014 | Yeung et al. | |

* cited by examiner

*Primary Examiner* — Lincoln Donovan
*Assistant Examiner* — Diana J Cheng
(74) *Attorney, Agent, or Firm* — Patent Capital Group

(57) ABSTRACT

An exemplary level shifter includes a clock level shifter configured to generate a level shifted clock signal from an input clock signal; and a switched capacitor logic controller coupled to the clock level shifter. The switched capacitor logic controller is configured to steer the level shifted clock signal based on a data signal and the input clock signal, providing a level shifted version of the data signal.

20 Claims, 6 Drawing Sheets

LEVEL SHIFTER

TECHNICAL FIELD

The present disclosure relates generally to circuits, and more particularly, level shifters.

BACKGROUND

An electronic system often includes circuitry having different supply voltages. The electronic system typically has a core supply voltage for powering the circuitry, where the core supply voltage is kept low to conserve power. The circuitry, however, may require supply voltages higher than the core supply voltage. For example, one circuit component may need to drive another circuit component with a voltage level higher than the core supply voltage. In such applications, a level shifter can be implemented as an interface between the circuit components operating in different voltage domains, where the level shifter can shift a signal from one voltage level to another voltage level. For example, the level shifter can take an input signal from one circuit component having a first voltage domain that ranges from 0 V to the core supply voltage and generate an output signal for another circuit component that has a second voltage domain ranging from 0 V to a voltage higher than the core supply voltage. Although existing level shifters have been generally adequate for their intended purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
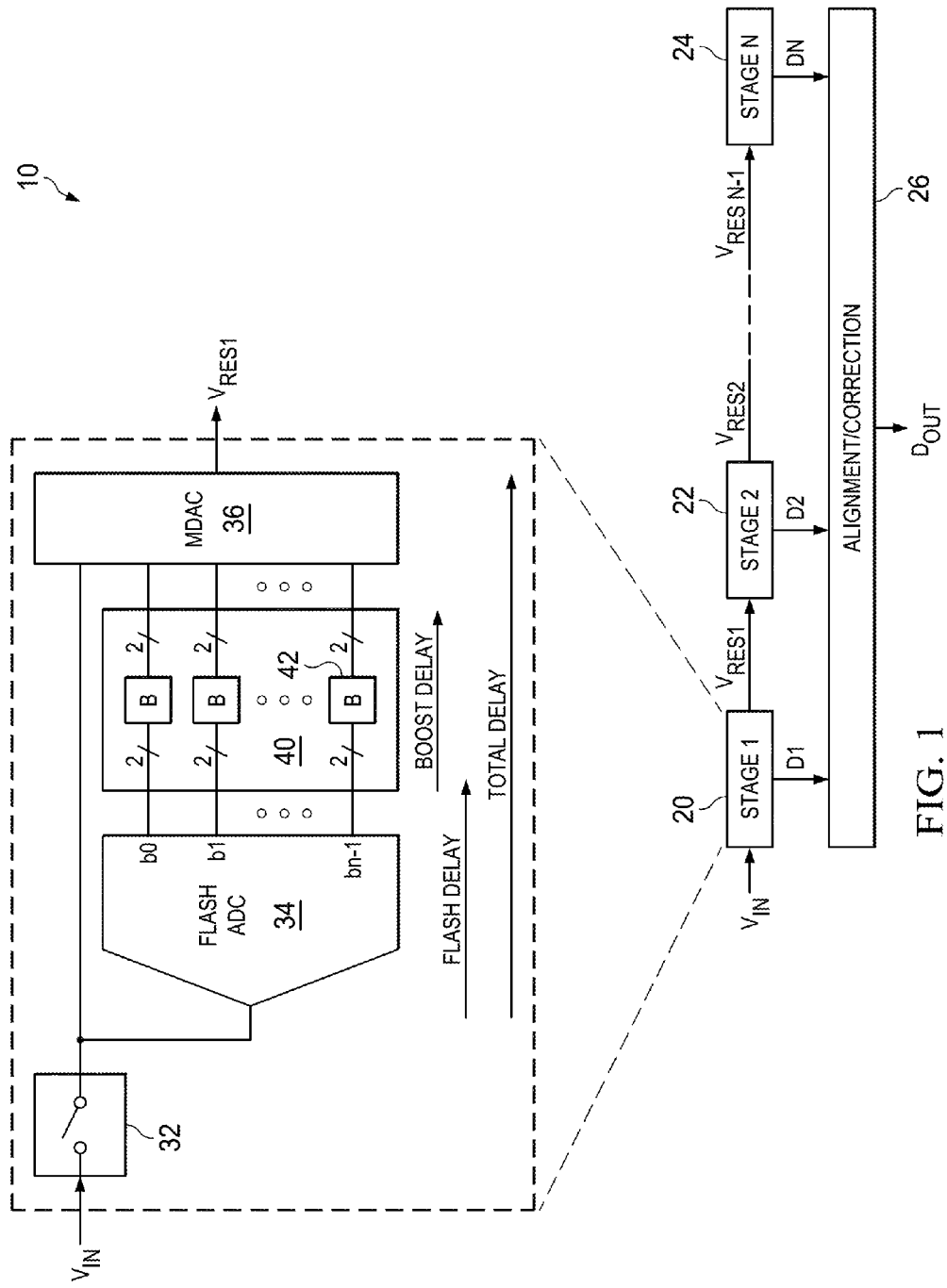
FIG. 1 is a schematic block diagram of an exemplary pipeline analog-to-digital converter according to various aspects of the present disclosure.

Various level shifters are described herein implement data signal controlled steering of a level shifted clock signal for level shifting signals. An exemplary level shifter includes a clock level shifter configured to generate a level shifted clock signal from an input clock signal; and a switched capacitor logic controller coupled to the clock level shifter. The switched capacitor logic controller is configured to steer the level shifted clock signal based on a data signal and the input clock signal, providing a level shifted version of the data signal. The clock level shifter can include a charge capacitor configured to provide the level shifted clock signal from the input clock signal, and a capacitor configured to provide a complementary level shifted clock signal from a complementary input clock signal. In various implementations, a single charge capacitor is used to charge a differential capacitive load. In various implementations, the clock level shifter and the switched capacitor logic controller are configured to generate the level shifted version of the data signal operating solely on a core supply voltage.

In some embodiments, the switched capacitor logic controller includes a negated AND (NAND) gate configured to generate a NAND logic gate signal based on the data signal and the input clock signal; a switch circuit coupled to the NAND gate and the clock level shifter, wherein the switch circuit steers the level shifted clock signal based on the NAND logic gate signal; and a capacitor coupled to the clock level shifter and the switch circuit, wherein the capacitor is configured to provide another level shifted input clock signal. The switch circuit can include a first switch having a gate coupled to a control voltage, a source coupled to the NAND gate, and a drain coupled to a first node charged by the another level shifted input clock signal; a second switch having a gate coupled to the first node, a source coupled to a second node charged by the level shifted clock signal from the clock level shifter, and a drain coupled with an output node; and a third switch having a gate coupled to the complementary level shifted clock signal, a source coupled to the first node, and drain coupled to the control voltage. The first switch, the second switch, and the third switch are configured such that the second switch pulls the level shifted clock signal from the second node to the output node when the first switch pulls a voltage level down at the first node. In various embodiments, the second switch is a p-type metal-oxide-semiconductor transistor and the first switch and the third switch are n-type metal-oxide-semiconductor transistors.

In some embodiments, the switched capacitor logic controller includes a NOR gate that generates a NOR logic gate signal based on the data signal and the complementary input clock signal; a switch circuit coupled to the NOR gate and the clock level shifter, wherein the switch circuit steers the level shifted clock signal based on the NOR logic gate signal; and a capacitor coupled to the NOR gate and the switch circuit, wherein the capacitor is configured to generate a level-shifted NOR logic gate signal. The switch circuit can include a first switch having a gate coupled to a first node charged by the level-shifted NOR logic gate signal, a source coupled with a second node charged by the level shifted clock signal from the clock level shifter, and a drain coupled with an output node; and a second switch having a gate coupled with the complementary level shifted clock signal, a source coupled with the first node, and a drain coupled with a control voltage. The first switch is configured to pull the level shifted clock signal to the output node when the NOR gate pulls a voltage level down at the first node. In various embodiments, the first switch is a p-type metal-oxide-semiconductor transistor and the second switch is an n-type metal-oxide-semiconductor transistor.

An exemplary method for shifting a data signal from a first voltage domain to a second voltage domain can include generating a level shifted clock signal from an input clock signal; and steering the level shifted clock signal based on the data signal and the input clock signal to provide a level shifted version of the data signal.

In some embodiments, steering the level shifted clock signal includes generating a logic gate signal based on the data signal and the input clock signal, where the logic gate signal drives a switch circuit for steering the level shifted clock signal. The logic gate signal has a low state and a high state, and the steering can further include outputting the level shifted version of the data signal when the logic gate signal is in the low state. In various embodiments, where the switch circuit includes a switch, the method further includes applying the level shifted clock signal to a first node coupled with a gate of the switch and a second node coupled with a source of the switch, and pulling a voltage level down at the first node when the logic gate signal is in a low state and the input clock signal is in a high state, such that the switch conducts the level shifted clock signal at the second node to a load.

In some embodiments, steering the level shifted clock signal includes generating a logic gate signal based on the data signal and a complementary input clock signal, wherein the logic gate signal drives a switch circuit for steering the level shifted clock signal. The logic gate signal has a low state and a high state, and the steering can further include outputting the level shifted version of the data signal when the logic gate signal is in the low state. In various embodiments, where the switch circuit includes a switch, the method further includes applying a level shifted logic gate signal to a first node coupled with a gate of a switch of the switch circuit; applying the level shifted clock signal to a second node coupled with a source of the switch; and pulling a voltage level down at the first node when the logic gate signal is in a low state and the input clock signal is in a high state, such that the switch conducts the level shifted clock signal at the second node to a load.

DETAILED DESCRIPTION OF EXAMPLE EMBODIMENTS

FIG. 1 is a schematic block diagram of an exemplary pipeline analog-to-digital converter (ADC) 10 according to various aspects of the present disclosure. Pipeline ADC 10 is an electronic device (including an electronic circuit and/or one or more electronic components) configured to receive and convert an analog input signal $V_{IN}$ into a corresponding digital output signal $D_{OUT}$. Digital output signal $D_{OUT}$ represents an n-bit digital code, where n is any number depending on design requirements of pipeline ADC 10. FIG. 1 has been simplified for the sake of clarity to better understand the inventive concepts of the present disclosure. Additional features can be added in pipeline ADC 10, and some of the features described can be replaced or eliminated in other embodiments of pipeline ADC 10.

Pipeline ADC 10 includes cascaded stages that process analog input signal $V_{IN}$ into digital output signal $D_{OUT}$. In the depicted embodiment, pipeline ADC 10 includes stage 20 (Stage 1), stage 22 (Stage 2), and stage 24 (Stage N, where N is a total number of stages). In operation, each stage processes (for example, quantizes) an analog input signal to generate a digital output signal and an analog residue signal for a next stage of pipeline ADC 10 for further processing. In the depicted embodiment, Stage 1 processes analog input signal $V_{IN}$ to generate a digital signal $D_1$ and an analog residue signal $V_{RES1}$; Stage 2 processes analog residue signal $V_{RES1}$ to generate a digital signal $D_2$ and an analog residue signal $V_{RES2}$; and Stage N processes analog residue signal $V_{RES\_N-1}$ to generate a digital signal $D_N$. Digital signals D1, D2, . . . , and DN each represent n-bit digital code, where n is any number depending on design requirements of pipeline ADC 10. The n-bit digital code can be a same number or different number of bits for each digital signal D1, D2, . . . , and DN. Pipeline ADC 10 further includes an alignment/correction module 26 that receives digital signals D1, D2, . . . , and DN and assembles these digital signals into digital output signal $D_{OUT}$. In various implementations, the various digital signals D1, D2, . . . , and DN are received sequentially through a series of clock cycles (not shown). Alignment/correction module 26 can insert appropriate delays, insert bit shifts, correct conversion errors, perform other alignment/correction, or a combination thereof to digital signals D1, D2, . . . , and DN to generate digital output signal $D_{OUT}$.

An exemplary configuration for stages of pipeline ADC 10 is depicted for Stage 1, which includes a sampler 32, an ADC 34 (in the depicted embodiment, a flash ADC), and a multiplying digital-to-analog converter (MDAC) 36. Sampler 32 can provide samples of an analog input signal (such as analog input signal $V_{IN}$) at a rate given by a system clock signal (CDs). In various implementations, sampler 32 can be a sample-and-hold amplifier (SHA). Flash ADC 34 converts a respective analog input signal (such as analog input signal $V_{IN}$) to a corresponding digital signal (such as digital signal D1). As noted, digital signal D1 can represent n-bit digital code. For example, digital signal D1 includes bits b0, b1, . . . through bn-1, where n is a total number of bits. In various implementations, flash ADC 34 includes an array of comparators, each comparing analog input signal $V_{IN}$ to a unique reference voltage. Flash ADC 34 can further include a voltage ladder (constructed from resistors and/or capacitors, for example) for providing the unique reference voltages to the comparator array. MDAC 36 converts the corresponding digital signal, such as digital signal D1, into a residual analog signal, such as residue analog signal $V_{RES1}$. MDAC 36 can include a DAC, a difference operation module, and a gain module (such as an amplifier). For example, in the depicted embodiment, a DAC can convert corresponding digital signal D1 to a corresponding analog signal that is received by the difference operation module, which generates a difference signal by subtracting corresponding analog signal from analog input signal $V_{IN}$. An amplifier can process (for example, amplify and/or level shift) difference signal to generate residue analog signal $V_{RES1}$, which can be processed by a succeeding stage of pipeline ADC 10, such as Stage 2.

Oftentimes, higher than normal operating signal levels are needed to drive MDAC 36. For example, one or more switches controlling MDAC 36, such as amplifier gain levels and/or offset levels of MDAC 36, may require voltage control signals higher than a core supply voltage of pipeline ADC 10 (in other words, outside a normal operating voltage range, such as 0 V to core supply voltage ($V_{DD}$) of pipeline ADC 10), such that signal levels from flash ADC 34 need shifting to a higher, appropriate voltage range that can drive switches of MDAC 36. To supply the appropriate signal levels, a level shifter (also referred to as a booster or boost circuit) can be implemented at an interface of flash ADC 34 and MDAC 36 to shift signals from one voltage level to another voltage level. In various implementations, a level shifter can multiply a capacitive load on the comparator array of flash ADC 34 to increase signal levels from the flash ADC 34. For example, in the depicted embodiment, Stage 1 includes a level shifter 40 configured between flash ADC 34 and MDAC 36 that boosts digital signal D1 to levels suitable for driving MDAC 36. Level shifter 40 includes a booster 42 for boosting signals associated with each bit of digital signal D1 (such as bits b0, b1, . . . through bn-1). In various implementations, an n-bit flash ADC 34 boosts 2*n signals, such that each booster 42 boosts two signals associated with each bit of digital signal D1

Pipeline ADC 10 can sample only as fast as flash ADC 34 in its first stage (Stage 1) can provide control signals, such as digital signal D1, to MDAC 36. More specifically, MDAC 36 waits for a decision to propagate through flash ADC 34, depicted as Flash Delay in FIG. 1, and level shifter 40, depicted as Boost Delay in FIG. 1, before providing residue analog signal $V_{RES1}$. Similarly, each successive stage has an associated propagation delay. Pipeline ADC 10 is thus configured to minimize overall propagation delay (depicted as Total Delay) in each stage to optimize operations, for example, by maximizing sample rates. The following discussion describes various level shifter configurations for level shifter 40 that can be implemented in pipeline ADC 10 to optimize performance. The level shifter configurations described herein can exhibit minimal propagation delay (for example, minimal boost delay) and sufficient boost levels for driving MDAC 36 while using a core supply voltage ($V_{DD}$).

Figure 2:
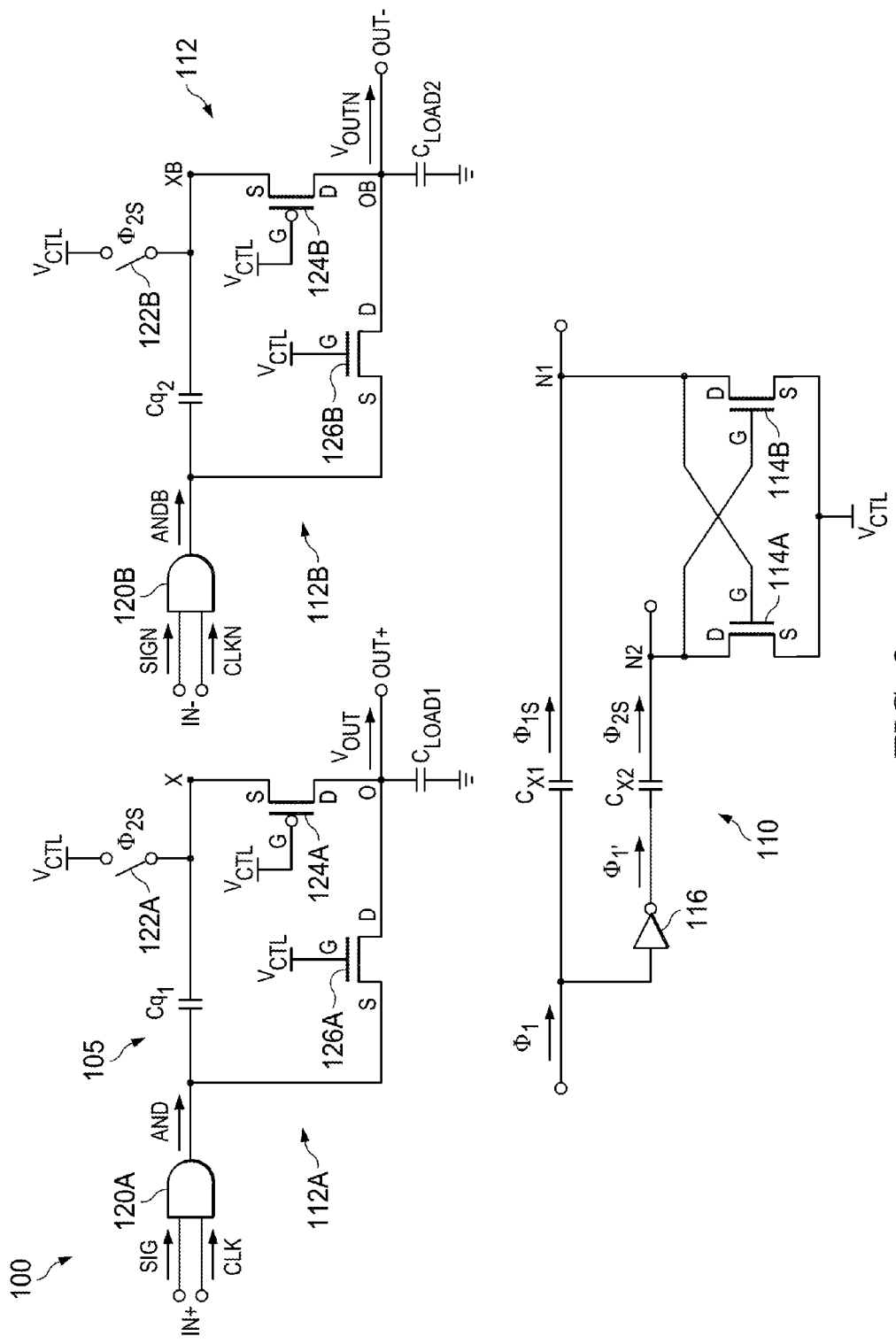
FIG. 2 is a schematic circuit diagram of an exemplary level shifter according to various aspects of the present disclosure.

FIG. 2 is a schematic circuit diagram of an exemplary level shifter 100 according to various aspects of the present disclosure. Level shifter 100 is an electronic device (including an electronic circuit and/or one or more electronic components) that shifts a signal from one voltage level to another voltage level. In various implementations, level shifter 100 can connect one digital circuit that uses one logic level to another digital circuit that uses another logic level. For purposes of the following discussion, level shifter 100 can be implemented in pipeline ADC 10, for example in Stage 1, as level shifter 40 at an interface of flash ADC 34 and MDAC 36. FIG. 2 has been simplified for the sake of clarity to better understand the inventive concepts of the present disclosure. Additional features can be added in level shifter 100, and some of the features described can be replaced or eliminated in other embodiments of level shifter 100.

Level shifter 100 includes a booster 105 has differential inputs (such as IN+ and IN−) arranged to receive differential input signals and differential outputs (such as OUT+ and OUT−) arranged to provide differential output signals. In the depicted embodiment, booster 105 is configured to receive a data signal SIG and a data signal SIGN and generate a digital output signal $V_{OUT}$ and a digital output signal $V_{OUTN}$. Data signal SIG and data signal SIGN can transition between a low voltage level represented by a digital 0 and a high voltage level represented by a digital 1. In various implementations, booster 105 boosts data signal SIG and data signal SIGN from flash ADC 34 (for example, from a latched comparator of flash ADC 34) sufficiently for driving MDAC 36, represented by output signal $V_{OUT}$ and output signal $V_{OUTN}$. Output signal $V_{OUT}$ and output signal $V_{OUTN}$ transition between a low voltage level (such as 0 V) and a high voltage level ($V_{HI}$) that is greater than control voltage $V_{CTL}$ (for example, $V_{HI}=V_{CTL}+\Delta V$). Level shifter 100 can include more than one booster 105, such that a booster is provided for boosting signals associated with each bit of a digital signal received from flash ADC 34, such as bits b0, b1, . . . through bn-1.

Booster 105 can boost data signals (for example, digital signals received from flash ADC 34) by implementing a clock level shifter 110 and a switched capacitor logic controller 112. Switched capacitor logic controller 112 level-shifts data signals for driving a load, where clock level shifter 110 generates a level shifted clock signal for driving switches of switched capacitor logic controller 112. In various implementations, switched capacitor logic controller 112 is AC coupled to flash ADC 34. For example, as described further below, booster 105 includes a charge capacitor placed in series between flash ADC 34 (in particular, a comparator of flash ADC 34) and MDAC 36, such that the charge capacitor level-shifts data signals received from flash ADC 34 for sufficiently driving MDAC 36, such as various switches of MDAC 36. Such configuration can minimize propagation delay while using a supply voltage less than or equal to the core supply voltage.

Clock level shifter 110 receives an input clock $\phi_1$ that transitions between a low voltage level and a high voltage level of an input clock voltage domain. For example, input clock $\phi_1$ may transition between 0 V and a control voltage $V_{CTL}$ (such as a core supply voltage). From input clock $\phi_1$, clock level shifter 110 generates a level-shifted output clock $\phi_{1S}$ and a complementary level-shifted output clock $\phi_{2S}$, which can be used to drive switched capacitor logic controller 112. Level-shifted output clock $\phi_{1S}$ and complementary level-shifted output clock $\phi_{2S}$ transition between a low voltage level and a high voltage level in an output clock voltage domain, which is different than the input clock voltage domain for input clock $\phi_1$. Clock level shifter 110 can be configured to up shift input clock $\phi_1$ to generate level-shifted output clock $\phi_{1S}$ and complementary level-shifted output clock $\phi_{2S}$, where the input clock voltage domain's high voltage level can be used to set the low voltage level for the output clock voltage level domain. For example, level-shifted output clock $\phi_{1S}$ and complementary level-shifted output clock $\phi_{2S}$ may transition between control voltage $V_{CTL}$ and a voltage greater than control voltage $V_{CTL}$ (such as $V_{HI}=V_{CTL}+\Delta V$). Note that level-shifted output clock $\phi_{1S}$ has the output clock voltage domain's high voltage level when complementary level-shifted output clock $\phi_{2S}$ has the output clock voltage domain's low voltage level, and vice versa.

In FIG. 2, clock level shifter 110 includes a pair of capacitors $C_{X1}$ and $C_{X2}$, a pair of switches 114A and 114B, and an inverter 116. In the depicted embodiment, switch 114A and switch 114B are cross-coupled transistors, such as cross-coupled p-type metal-oxide-semiconductor (PMOS) transistors. Each switch has a gate (G), a source (S), and a drain (D). Each switch 114A and 114B has its source coupled to control voltage $V_{CTL}$. Switch 114A has its gate coupled to the drain of switch 114B, and switch 114B has its gate coupled to the drain of switch 114A. Capacitor $C_{X1}$ has a first terminal coupled to a node N1 (such that capacitor $C_{X1}$ is also coupled to the drain of switch 114B) and a second terminal coupled to an input node for receiving input clock $\phi_1$. Capacitor $C_{X2}$ has a first terminal coupled to a node N2 (such that capacitor $C_{X2}$ is also coupled to the drain of switch 114A) and a second terminal coupled to the input node for receiving a complement of input clock $\phi_1$. For example, capacitor $C_{X2}$ has a second terminal coupled to inverter 116, which provides a complementary input clock $\phi_1$. to capacitor $C_{X2}$. Capacitor $C_{X1}$ and capacitor $C_{X2}$ respectively provide level-shifted output clock $\phi_{1S}$ and complementary level-shifted output clock $\phi_{2S}$, which represent up-shifted versions of input clock $\phi_1$ that may be taken respectively from node N1 or node N2 to drive switch capacitor logic controller 112. During operation, switch 114A and switch 114B can be activated in an alternating manner to charge capacitors $C_{X1}$ and $C_{X2}$, such that level-shifted output clock $\phi_{1S}$ and complementary level-shifted output clock $\phi_{2S}$ can transition from the output clock domain's low voltage level (such as control voltage $V_{CTL}$) to the output clock domain's high voltage level (such as $V_{HI}=V_{CTL}+\Delta V$). Capacitor sizes for capacitor $C_{X1}$ and capacitor $C_{X2}$ may be adjusted according to operating requirements for clock level shifter 110, switched capacitor logic controller 112, and/or level shifter 100, such as desired output clock voltage domain levels.

Switched capacitor logic controller 112 drives (charges) a load, represented by a load capacitor $C_{LOAD1}$ and a load capacitor $C_{LOAD2}$, using charge capacitors, such as a charge capacitor $Cq_1$ and a charge capacitor $Cq_2$. In various implementations, charge capacitor $Cq_1$ and charge capacitor $Cq_2$ are placed in series between flash ADC 34 and MDAC 36, where one plate (ADC side) of the charge capacitor is driven by a data signal from flash ADC 34 (data signal SIG or data signal SIGN) and one plate (MDAC side) is driven by a switched capacitor operation. In the depicted embodiment, a switched capacitor logic controller portion 112A includes charge capacitor $Cq_1$, an AND gate 120A, and switch circuitry (a switch 122A, a switch 124A, and a switch 126A); and a switched capacitor logic controller portion 112B includes charge capacitor $Cq_2$, an AND gate 122B, and switch circuitry (a switch 122B, a switch 124B, and a switch 126B). Charge capacitor $Cq_1$ has a terminal coupled to AND gate 112A and another terminal coupled to switch 122A. Charge capacitor $Cq_2$ has a terminal coupled to AND gate 120B and another terminal coupled to switch 122B.

AND gate 120A and AND gate 120B generate logic gate signals, a logic gate signal AND and a logic gate signal ANDB, for respectively powering (charging) load capacitor $C_{LOAD1}$ and ad capacitor $C_{LOAD2}$, where charge capacitor $Cq_1$ and charge capacitor $Cq_2$ boost signal levels of logic gate signal AND and logic gate signal ANDB, and the switch circuitry respectively steers the boosted logic gate signals appropriately. In the depicted embodiment, a clock signal CLK gates decisions of switched capacitor logic controller 112, where active rising edges of AND gate 120A and AND gate 120B provide logic gate signals for charging load capacitor $C_{LOAD1}$ and load capacitor $C_{LOAD2}$, which are boosted respectively by charge capacitor $Cq_1$ and charge capacitor $Cq_2$. The active rising edges of AND gate 120A and AND gate 120B can further control the switch circuitry that steers the boosted logic gate signals. Typically, a latched comparator of flash ADC 34 provides data signal SIG and data signal SIGN to booster 105, where data signal SIG and data signal SIGN can have three possible output states when a clock signal of the flash ADC 34 is high, provided in Table 1 below.

TABLE 1

FLASH ADC States & Output

| STATE | SIG | SIGN |
|---|---|---|
| $V_{IN} > V_{REF}$ | 1 | 0 |
| $V_{IN} < V_{REF}$ | 0 | 1 |
| No Decision | 0 | 0 |

When input voltage $V_{IN}$ is greater than its associated reference voltage $V_{REF}$, latched comparator of flash ADC 34 outputs data signal SIG in a high state (such as a digital 1) and data signal SIGN in a low state (such as a digital 0). When input voltage $V_{IN}$ is less than its associated reference voltage $V_{REF}$, latched comparator outputs data signal SIG in a low state and data signal SIGN in a high state. When latched comparator does not make a decision, latched comparator outputs data signal SIG and data signal SIGN in a low state. AND gate 120A receives data signal SIG and clock signal CLK (in some implementations, associated with a system clock, such as a clock associated with pipeline ADC 10), and compares data signal SIG with clock signal CLK to generate logic gate signal AND. Similarly, AND gate 120B receives data signal SIGN and clock signal CLK, and compares data signal SIGN with clock signal CLK to generate logic gate signal ANDB. In various implementations, AND gate 120A outputs logic gate signal AND in a high state when data signal SIG and clock signal CLK are both in a high state, and outputs logic gate signal AND in a low state otherwise; and AND gate 120B outputs logic gate signal ANDB in a high state when data signal SIGN and clock signal CLK are both in a high state, and outputs logic gate signal ANDB in a low state otherwise. For example, logic gate signal AND and logic gate signal ANDB can transition between a low voltage represented by a digital zero and a high voltage represented by a digital one. Table 2 depicts possible inputs and associated outputs for AND gate 120A, and Table 3 depicts possible inputs and associated outputs for AND gate 120B.

TABLE 2

AND Gate 120A Inputs/Output

| SIG | CLK | AND |
|---|---|---|
| 1 | 0 | 0 |
| 0 | 1 | 0 |
| 0 | 0 | 0 |
| 1 | 1 | 1 |

TABLE 3

AND Gate 120B Inputs/Output

| SIGN | CLK | ANDB |
|---|---|---|
| 1 | 0 | 0 |
| 0 | 1 | 0 |
| 0 | 0 | 0 |
| 1 | 1 | 1 |

Accordingly, one of AND gate 120A and AND gate 120B will output a logic gate signal in a high state, such that only logic gate signal AND or logic gate signal ANDB is in a high state at a time. Such result can be referred to as a one-hot type output (result), meaning that at most, one load (either load capacitor $C_{LOAD1}$ or load capacitor $C_{LOAD2}$) is driven to a high state during a decision cycle. Therefore, only one of the two charge capacitors—charge capacitor $Cq_1$ or charge capacitor $Cq_2$—is used during a decision cycle. Furthermore, it is noted that charge is delivered to load capacitor $C_{LOAD1}$ or load capacitor $C_{LOAD2}$ only upon flash ADC 34 generating a high output (in other words, either data signal SIG or data signal SIGN is a digital one).

Switches 122A, 122B, 124A, 124B, 126A, and 126B are transistors that include a gate (G) interposed by a source (S) and a drain (D), such as field effect transistors (FETs). Switch 122A has a source coupled to charge capacitor $Cq_1$ (which is also coupled to a node X), a drain coupled to control voltage $V_{CTL}$, and a gate coupled to complementary level-shifted output clock $\phi_{2S}$; and switch 122B has a source coupled to charge capacitor $Cq_2$ (which is also coupled to a node XB), a drain coupled to control voltage $V_{CTL}$, and a gate coupled to complementary level-shifted output clock $\phi_{2S}$. Both switch 122A and switch 122B are driven by complementary level-shifted output clock $\phi_{2S}$, which is generated by clock level shifter 110, such that switch 122A and switch 122B transition to an on state when complementary level-shifted output clock $\phi_{2S}$ is in a high state. Switch 124A has a gate coupled to control voltage $V_{CTL}$, a drain coupled to differential output OUT+, and a source coupled to node X; and switch 124B has a gate coupled to control voltage $V_{CTL}$, a drain coupled to differential output OUT–, and a source coupled to node XB. Switch 126A has a gate coupled to control voltage $V_{CTL}$, a source coupled to AND gate 120A, and a drain coupled to an output node O (which is coupled to differential output OUT+); and switch 126B has a gate coupled to control voltage $V_{CTL}$, a source coupled to AND gate 120B, and a drain coupled to an output node OB (which is coupled to differential output OUT–). In the depicted embodiment, switch 122A and switch 122B are NMOS transistors, switch 124A and switch 124B are PMOS transistors, and switch 126A and switch 126B are NMOS transistors, though the present disclosure contemplates various configurations of NMOS and PMOS transistors for switched capacitor logic controller 112.

In operation, when switch 122A and switch 122B are in an on state, a load side (such as the MDAC side) of charge capacitor $C_{q1}$ and charge capacitor $C_{q2}$ is charged to some voltage, for example, to control voltage $V_{CTL}$. Switch 124A and switch 124B are source driven, such that switch 124A and switch 124B respectively conduct charge to load capacitor $C_{LOAD1}$ and load capacitor $C_{LOAD2}$ when a voltage of the source rises above a fixed voltage applied to the gate (here, control voltage $V_{CTL}$). For example, in an on state, switch 124A conducts charge from node X to load capacitor $C_{LOAD1}$, where node X represents a level-shifted version of logic gate signal AND, thus providing output signal $V_{OUT}$ in a boosted state (for example, having high voltage level $V_{HI}$). Similarly, in an on state, switch 124B conducts charge from node XB to load capacitor $C_{LOAD2}$, where node XB represents a level-shifted version of logic gate signal ANDB, thus providing output signal $V_{OUTN}$ in a boosted state (for example, having high voltage level $V_{HI}$). Since a phase of clock signal CLK gates AND gate 120A and AND gate 120B decisions, a voltage at the sources of switch 124A and switch 124B can be reset to control voltage $V_{CTL}$ when clock signal CLK is in a low state. For example, when complementary level-shifted clock signal $\phi_{2S}$ is in a high state, switch 122A and switch 122B initialize node X (and thus a voltage seen by sources of switch 124A and switch 124B) to control voltage $V_{CTL}$ providing refresh switch control for switch 124A and switch 124B on the complementary clock phase. Switch 126A and switch 126B can respectively keep output node O and output node OB in a low state, thus keeping output signal $V_{OUT}$ and output signal $V_{OUTN}$ set to the low state (such as 0 V) when neither gate decision is in a high state.

Figure 3:
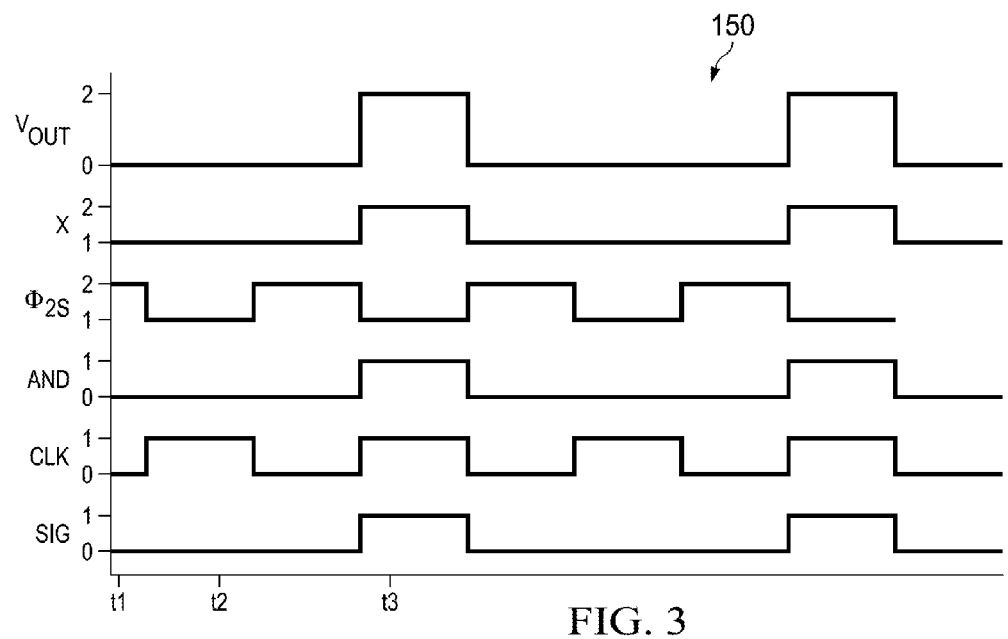
FIG. 3 is an exemplary timing diagram for the level shifter of FIG. 2 according to various aspects of the present disclosure.

FIG. 3 is an exemplary timing diagram 150 associated with operation of level shifter 100 according to various aspects of the present disclosure. Here, timing diagram 150 is associated with switched capacitor logic controller portion 105A, where AND gate 120A drives a load, delivering charge to load capacitor $C_{LOAD1}$. In a simplistic example, for purposes of the following discussion, a signal having a voltage level of 0 V is represented by 0, a voltage level of control voltage $V_{CTL}$ is represented by 1, and a voltage level of high voltage $V_{HI}$, ($V_{HI}$=control voltage $V_{CTL}$+$\Delta$V) is represented by 2.

At time t1, input clock signal CLK is in a low state (0). Accordingly, clock level shifter 110 generates complementary level-shifted output clock $\phi_{2S}$ in a high state (2), transitioning switch 122A to an on state for charging charge capacitor $C_{q1}$ to control voltage $V_{CTL}$, which also initializes node X to its associated low state, control voltage $V_{CTL}$. AND gate 120A generates logic gate signal AND in a low state (0), where both data signal SIG and input clock signal CLK are in a low state (0). Since a same voltage is applied to the gate and source of switch 124A (for example, a voltage seen at the gate is control voltage $V_{CTL}$ and a voltage seen at the source is control voltage $V_{CTL}$ (the voltage at node X)), switch 124A is in an off state, such that output signal $V_{OUT}$ is in a low state (0). Switch 126A is also in an off state, again keeping node O in a low state.

At time t2, input clock signal CLK is in a high state (1). Accordingly, clock level shifter 110 generates complementary level-shifted output clock $\phi_{2S}$ in a low state (1), setting switch 122A to an off state. AND gate 120A generates logic gate signal AND in a low state (0), where data signal SIG is in a low state (0) and clock signal CLK is in the high state. Node X remains at its low state, control voltage $V_{CTL}$. Again, since a same voltage is applied to the gate and source of switch 124A (for example, a voltage seen at the gate is control voltage $V_{CTL}$ and a voltage seen at the source is control voltage $V_{CTL}$ (the voltage at node X)), switch 124A is in an off state, such that output signal $V_{OUT}$ is in a low state (0). Switch 126A is also in an off state, keeping node O in a low state.

At time t3, input clock signal CLK is in a low state (0). Accordingly, complementary level-shifted output clock $\phi_{2S}$ in a low state (1), transitioning switch 122A to an off state. AND gate 120A generates logic gate signal AND in a high state (1), where data signal SIG and clock signal CLK are both in a high state (1), increasing a voltage stored on charge capacitor $C_{q1}$ from control voltage $V_{CTL}$ to some additional voltage. In a simplistic example, when charge capacitor $C_{q1}$ receives logic gate signal AND in the high state, charge capacitor $C_{q1}$ essentially adds voltage to the stored voltage, transitioning from the control voltage $V_{CTL}$ to some additional voltage to provide a level-shifted logic gate signal AND. For example, a voltage associated with a load side (or MDAC side) of charge capacitor $C_{q1}$ rises from an initial level (such as control voltage $V_{CTL}$) to some additional voltage level ($V_{HI}$=control voltage $V_{CTL}$+$\Delta$V). In various implementations, the additional voltage is a function of a ratio of the level-shifted capacitance (a capacitance of charge capacitor $C_{q1}$) and the load capacitance (a capacitance of load capacitor $C_{LOAD1}$). Charge capacitor $C_{q1}$ thus provides the level-shifted logic gate signal AND to node X, transitioning node X to its high state, high voltage $V_{HI}$. Since a different voltage is now applied to the gate and source of switch 124A (for example, a voltage seen at the gate is control voltage $V_{CTL}$ and a voltage seen at the source is high voltage $V_{HI}$ (the voltage at node X)), switch 124A transitions to an on state. Switch 124A then pulls the level-shifted logic gate signal AND at node X to output node O, providing logic output signal $V_{OUT}$ in a boosted state (for example, having the high voltage $V_{HI}$). Further, switch 126A transitions to an on state. In various implementations, boosted logic output signal $V_{OUT}$ exhibits signal levels that can sufficiently drive the load, such as MDAC 36. It is understood that switched capacitor logic controller portion 112B operates similarly, noting that only switched capacitor logic controller portion 112A or switched capacitor logic controller portion 112B will provide boosted signal levels at any one time. FIG. 3 has been simplified for the sake of clarity to better understand the inventive concepts of the present disclosure. Additional features can be added in timing diagram 150, and some of the features described can be replaced or eliminated in other embodiments of timing diagram 150.

In the depicted embodiment, keeping in mind that a charge (Q) between plates of a capacitor is given by:

$$Q = C \times V$$

where C is a capacitance of the capacitor and V is a voltage across plates of the capacitor, a maximum output voltage delivered to the load is a function of load capacitance ($C_{LOAD}$) (such as that associated with load capacitor $C_{LOAD1}$ or load capacitor $C_{LOAD2}$) to charge capacitance ($C_q$) (such as that associated with charge capacitor $C_{q1}$ or charge capacitor $C_{q2}$). In the present example, when the AND gate output transitions to a high state (for example, logic gate signal AND or logic gate signal ANDB transitions voltage from 0 V to control voltage $V_{CTL}$), the load (for example, output signal $V_{OUT}$ or output signal $V_{OUTN}$) rises from 0 V to:

$$V_{OUTMAX} = \Delta V + V_{CTL} = (F \times V_{CTL}) + V_{CTL}$$

where F is a fraction of $V_{CTL}$ represented by:

$$F = \frac{C_q}{C_q + C_{LOAD}}.$$

To achieve a desired fraction of control voltage swing to boost the voltage level by $\Delta V$, a size of $C_q$ can be determined:

$$C_q = \frac{F}{1 - F} \times C_{LOAD}.$$

Since $C_q$ is in series with $C_{LOAD}$, the logic gate generating the boosted signal (here, AND gate 120A or AND gate 120B) sees an effective capacitance much lower than $C_q$. Though this allows relatively small gates to deliver high slew rates, to produce a substantial increase in voltage and achieve desired voltage swings, level shifter 100 must typically implement a charge capacitor $C_q$ much larger than a load capacitor $C_{LOAD}$. Such large charge capacitor $C_q$ can consume more than desirable area and power, particularly in the depicted embodiment, where two charge capacitors (charge capacitor $C_{q1}$ and charge capacitor $C_{q2}$) are needed for providing boosted signal levels. Charge capacitor $C_q$ may also heavily load the logic gate driver (here, the AND gate), necessitating that the logic gate driver generating the signal for boosting be sized up to increase drive strength to supply sufficient charge for the load capacitance. When implemented for level shifting signals from a flash ADC, an entire comparator will also likely consume more area and more power to compensate for the aforementioned issues. For example, since level shifters typically multiply the capacitive load on the flash ADC comparators, flash ADC area in its entirety must be increased to maintain very low propagation delay, increasing power and area of the entire signal path. Since ADCs typically implement many comparators in each pipeline stage, any additional area and power consumed will be multiplied by a total number of comparators used in the ADC.

As noted, level shifter 100 boosts signals using a one-hot type output (result), meaning that at most, one capacitor load (either load capacitor $C_{LOAD1}$ or load capacitor $C_{LOAD2}$) is driven to a high state during each decision cycle. Therefore, only one of the two charge capacitors—charge capacitor $Cq_1$ or charge capacitor $Cq_2$—is used during a decision cycle. The present disclosure recognizes that the charge needed to drive both loads can be generated using a same charge capacitor ($C_q$), significantly decreasing a level shifter's power and area consumption. In particular, to boost N total signals, level shifter 100 needs 2*N charge capacitors (charge capacitor $Cq_1$ or charge capacitor $Cq_2$), dominating a significant area of booster 105. By using a same charge capacitor for each signal, N charge capacitors can be implemented to provide significant area savings, for both the level shifter and the entire signal path when implemented in a pipeline ADC. Such level shifter configurations can be achieved by removing a burden of driving a capacitive load off the switched capacitor logic controller (and, more generally, a data signal buffer), instead placing this burden on circuitry that can more efficiently do such, particularly the clock level shifter.

The following describes various level shifter configurations that implement data signal controlled steering of a level shifted clock signal for charging the load. Instead of using the data signals to charge the load (such as logic gate signals from the AND gates), the level shifter configurations described herein charge the load with a clock buffer, where it is more efficiently handled by steering a level-shifted clock signal to generate a level-shifted (amplified) version of a non-periodic data signal. By using the data signals to merely steer the level shifted clock signal, significant power and area savings can be realized by the level shifter configurations described herein, along with the various components of the data path (such as the flash ADC). Essentially, the level shifter configurations described below can charge the load with a boosted supply, instead of a boosted data signal. Different embodiments may have different advantages, and no particular advantage is necessarily required of any of the embodiments described herein.

Figure 4:
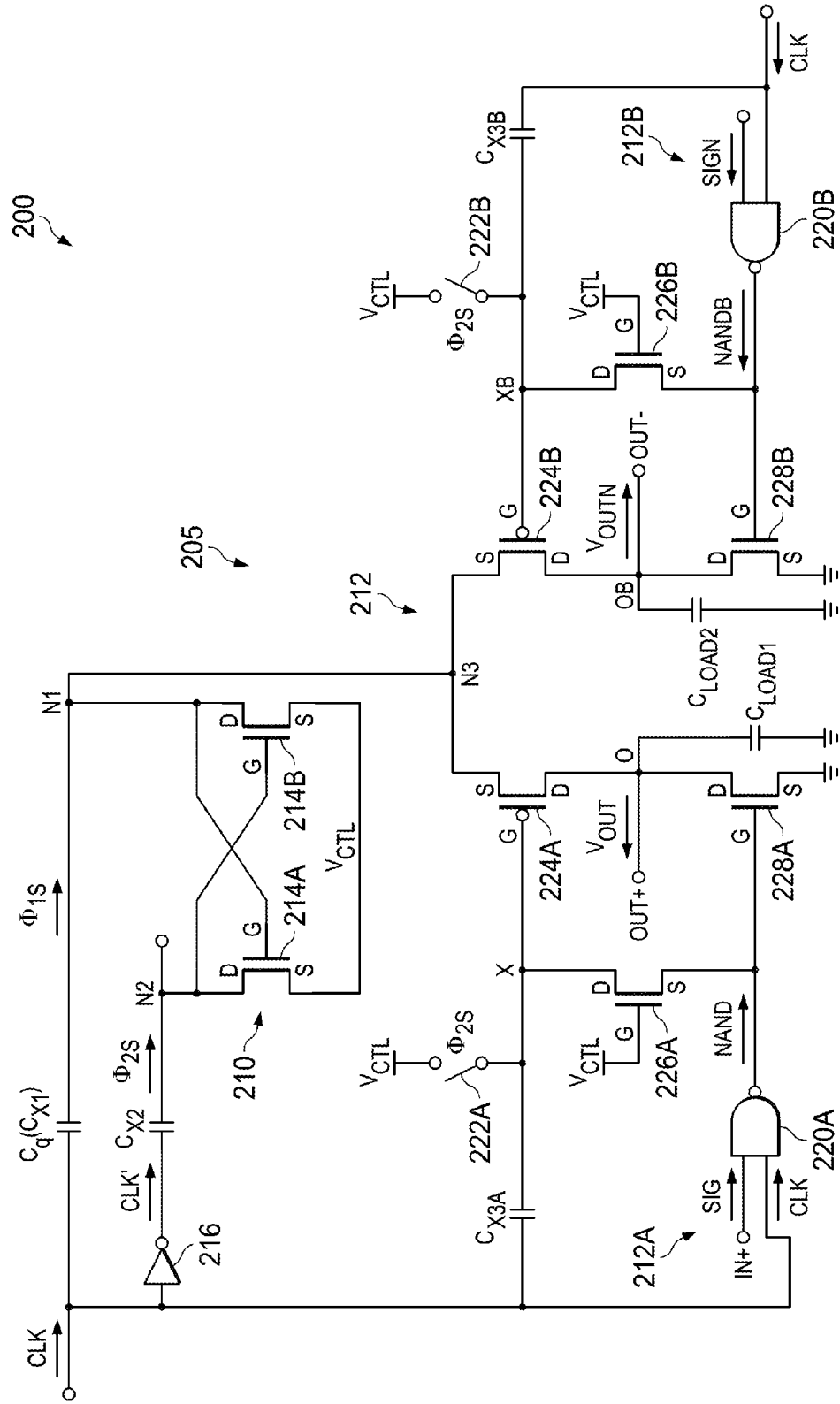
FIG. 4 is a schematic circuit diagram of another exemplary level shifter according to various aspects of the present disclosure.

FIG. 4 is a schematic circuit diagram of an exemplary level shifter 200 according to various aspects of the present disclosure. Level shifter 200 is an electronic device (including an electronic circuit and/or one or more electronic components) that shifts a signal from one voltage level to another voltage level. In various implementations, level shifter 200 can connect one digital circuit that uses one logic level to another digital circuit that uses another logic level. For purposes of the following discussion, level shifter 200 can be implemented in pipeline ADC 10, for example in Stage 1, as booster 40 at an interface of flash ADC 34 and MDAC 36. The embodiment of FIG. 4 is similar in many respects to the embodiment of FIG. 2. Accordingly, similar features in FIG. 2 and FIG. 4 are identified by the same reference numerals for clarity and simplicity. FIG. 4 has been simplified for the sake of clarity to better understand the inventive concepts of the present disclosure. Additional features can be added in level shifter 200, and some of the features described can be replaced or eliminated in other embodiments of level shifter 200.

Level shifter 200 includes a booster 205 having differential inputs (such as IN+ and IN−) arranged to receive differential input signals and differential outputs (such as OUT+ and OUT−) arranged to provide differential output signals. In the depicted embodiment, booster 205 is configured to receive a data signal SIG and a data signal SIGN and generate a digital output signal $V_{OUT}$ and a digital output signal $V_{OUTN}$—Data signal SIG and data signal SIGN can transition between a low voltage level represented by a digital 0 and a high voltage level represented by a digital 1. In various implementations, booster 205 boosts data signal SIG and data signal SIGN from flash ADC 34 (for example, from a latched comparator of flash ADC 34) sufficiently for driving MDAC 36, represented by output signal $V_{OUT}$ and output signal $V_{OUTN}$—Output signal $V_{OUT}$ and output signal $V_{OUTN}$ transition between a low voltage level (such as 0 V) and a high voltage level ($V_{HI}$) that is greater than control voltage $V_{CTL}$ (for example, $V_{HI}=V_{CTL}+\Delta V$). Level shifter 200 can include more than one booster 205, such that a booster is provided for boosting signals associated with each bit of a digital signal received from flash ADC 34, such as bits b0, b1, . . . through bn-1.

Booster 205 can also boost data signals (for example, digital signals received from flash ADC 34) by implementing a clock level shifter 210 and a switched capacitor logic controller 212. In FIG. 4, in contrast to level shifter 100, booster 205 uses a level shifted clock signal for charging the load, instead of a level shifted data signal. More specifically, clock level shifter 210 generates a level-shifted clock signal for delivering charge to the load, and switched capacitor logic controller 212 steers the level-shifted clock signal appropriately. The switched capacitor logic controller 212 (data path) thus drives a fraction of the load, compared to the switched capacitor logic controller 112 of level shifter 100, such that it can be much smaller, consuming less power and less area and further simplifying a data signal chain. Such configuration can also minimize propagation delay while using a supply voltage less than or equal to the core supply voltage.

Clock level shifter 210 receives an input clock signal CLK that transitions between a low voltage level and a high voltage level of an input clock voltage domain. For example, input clock signal CLK may transition between 0 V and a control voltage $V_{CTL}$ (such as a core supply voltage). From input clock signal CLK, clock level shifter 210 generates a level-shifted output clock $\phi_{1S}$ and a complementary level-shifted output clock $\phi_{2S}$, where level-shifted output clock $\phi_{1S}$ can be used to charge the load (here, a load capacitor $C_{LOAD1}$ and a load capacitor $C_{LOAD2}$) and complementary level-shifted output clock $\phi_{2S}$ can be used to drive switch capacitor logic controller 212. Level-shifted output clock $\phi_{1S}$ and complementary level-shifted output clock $\phi_{2S}$ transition between a low voltage level and a high voltage level in an output clock voltage domain, which is different than the input clock voltage domain for input clock $\phi_1$. Clock level shifter 210 can be configured to up shift input clock $\phi_1$ to generate level-shifted output clock $\phi_{1S}$ and complementary level-shifted output clock $\phi_{2S}$, where the input clock voltage domain's high voltage level can be used to set the low voltage level for the output clock voltage level domain. For example, level-shifted output clock $\phi_{1S}$ and complementary level-shifted output clock $\phi_{2S}$ may transition between control voltage $V_{CTL}$ and a voltage greater than control voltage $V_{CTL}$ (such as $V_{HI}=V_{CTL}+\Delta V$). Note that level-shifted output clock $\phi_{1S}$ has the output clock voltage domain's high voltage level when complementary level-shifted output clock $\phi_{2S}$ has the output clock voltage domain's low voltage level, and vice versa.

Clock level shifter 210 can include a pair of capacitors $C_{X1}$ and $C_{X2}$, a pair of switches 214A and 214B, and an inverter 216. In the depicted embodiment, switch 214A and switch 214B are cross-coupled transistors, such as cross-coupled p-type metal-oxide-semiconductor (PMOS) transistors. Each switch has a gate (G), a source (S), and a drain (D). Each switch 214A and 214B has its source coupled to control voltage $V_{CTL}$. Switch 214B has its gate coupled to the drain of switch 214A, and switch 214A has its gate coupled to the drain of switch 214B. Capacitor $C_{X1}$ has a first terminal coupled to node N1 (such that capacitor $C_{X1}$ is also coupled to the drain of switch 2146) and a second terminal coupled to an input node for receiving input clock signal CLK. Capacitor $C_{X2}$ has a first terminal coupled to node N2 (such that capacitor $C_{X2}$ is also coupled to the drain of switch 214A) and a second terminal coupled to the input node for receiving a complement of input clock signal CLK. For example, capacitor $C_{X2}$ has a second terminal coupled to inverter 216, which provides a complementary input clock signal CLK' to capacitor $C_{X2}$. Capacitor $C_{X1}$ and capacitor $C_{X2}$ respectively provide level-shifted output clock $\phi_{1S}$ and complementary level-shifted output clock $\phi_{2S}$, which represent up-shifted versions of input clock $\phi_1$ that may be taken respectively from node N1 or node N2 to charge the load and drive switch capacitor logic controller 112.

In operation, clock level shifter 210 drives (charges) a load, represented by load capacitor $C_{LOAD1}$ and load capacitor $C_{LOAD2}$. In the depicted embodiment, capacitor $C_{X1}$ serves as a charge capacitor $C_q$ for charging both load capacitor $C_{LOAD}$ and load capacitor $C_{LOAD2}$, where charge capacitor $C_q$ provides level-shifted output clock $\phi_{1S}$ for charging the load. Node N3 represents the level-shifted version of input clock signal CLK, which is coupled to switched capacitor logic controller 212. Further, complementary level-shifted output clock $\phi_{2S}$ can be used to drive switch circuitry of switch capacitor logic controller 212. Switch 214A and switch 214B can be activated in an alternating manner for charging charge capacitor $C_q$ and capacitor $C_{X2}$, such that level-shifted output clock $\phi_{1S}$ and complementary level-shifted output clock $\phi_{2S}$ can transition from the output clock domain's low voltage level (control voltage $V_{CTL}$) to the output clock domain's high voltage level ($V_{HI}=V_{CTL}+\Delta V$). Capacitor sizes for capacitor $C_{X1}$ and capacitor $C_{X2}$ may be adjusted according to operating requirements for clock level shifter 210, switched capacitor logic controller 212, and/or level shifter 200, such as desired output clock voltage domain levels.

Switched capacitor logic controller 212 is AC coupled to clock level shifter 210. Switched capacitor logic controller 212 steers level-shifted output clock $\phi_{1S}$ to appropriately charge load capacitor $C_{LOAD1}$ and load capacitor $C_{LOAD2}$. In level shifter 200, switched capacitor logic controller 212 implements a negated AND (NAND) logic gate and switch circuitry for steering. For example, in the depicted embodiment, a switched capacitor logic controller portion 212A includes capacitor $C_{X3A}$, an NAND gate 220A, and switch circuitry (a switch 222A, a switch 224A, a switch 226A, and a switch 228A); and a switched capacitor logic controller portion 212B includes capacitor $C_{X3B}$, an NAND gate 220B, and switch circuitry (a switch 222B, a switch 224B, a switch 226B, and a switch 228B). Capacitor $C_{X3A}$ has a terminal coupled to an input node for receiving input clock signal CLK and another terminal coupled to switch 222A, such that capacitor $C_{X3A}$ can provide and up-shifted version of input clock signal CLK at node X. Similarly, capacitor $C_{X3B}$ also has a terminal coupled to the input node for receiving input clock signal CLK and another terminal coupled to switch 222B, such that capacitor $C_{X3B}$ can provide and up-shifted version of input clock signal CLK at node XB.

NAND gate 220A and NAND gate 220B generate logic gate signals, a logic gate signal NAND and a logic gate signal NANDB, for respectively steering level-shifted output clock $\phi_{1S}$ for charging the load—here, load capacitor $C_{LOAD1}$ and load capacitor $C_{LOAD2}$. In the depicted embodiment, input clock signal CLK for clock level shifter 210 also gates decisions of switched capacitor logic controller 212, where active falling edges of NAND gate 220A and NAND gate 220B provide logic gate signals for controlling the switch circuitry that steers charge associated with level-shifted output clock $\phi_{1S}$ to load capacitor $C_{LOAD1}$ and load capacitor $C_{LOAD}$. Typically, a latched comparator of flash ADC 34 can provide data signal SIG and data signal SIGN to booster 205, where the various output states for data signal SIG and data signal SIGN are depicted in Table 1 above. In the depicted embodiment, NAND gate 220A receives data signal SIG and input clock signal CLK, and compares data signal SIG with input clock signal CLK to generate logic gate signal NAND. Similarly, NAND gate 220B receives data signal SIGN and input clock signal CLK, and compares data signal SIGN with input clock signal CLK to generate logic gate signal NANDB. In various implementations, NAND gate 220A outputs logic gate signal NAND in a low state when data signal SIG and input clock signal CLK are both in a high state, and outputs logic gate signal NAND in a high state otherwise; and NAND gate 220B outputs logic gate signal NANDB in a low state when data signal SIGN and input clock signal CLK are both in a high state, and outputs logic gate signal NANDB in a high state otherwise. For example, logic gate signal NAND and logic gate signal NANDB can transition between a low voltage represented by a digital zero and a high voltage represented by a digital one. Table 4 depicts possible inputs and associated outputs for NAND gate 220A, and Table 5 depicts possible inputs and associated outputs for NAND gate 220B.

TABLE 4

NAND Gate 212A Inputs/Output

| SIG | CLK | NAND |
|-----|-----|------|
| 1   | 0   | 1    |
| 0   | 1   | 1    |
| 0   | 0   | 1    |
| 1   | 1   | 0    |

TABLE 5

NAND Gate 212B Inputs/Output

| SIGN | CLK | NANDB |
|------|-----|-------|
| 1    | 0   | 1     |
| 0    | 1   | 1     |
| 0    | 0   | 1     |
| 1    | 1   | 0     |

Accordingly, one of NAND gate 220A and NAND gate 220B will output a logic gate signal in a high state. Since switched capacitor logic controller 212 exhibits a one-hot type output (result), meaning that either NAND gate 220A or NAND gate 220B will be driven to a low state, level shifter 200 can implement a single charge capacitor—charge capacitor $C_q$—for delivering charge to load capacitor $C_{LOAD1}$ or load capacitor $C_{LOAD2}$ when flash ADC 34 generates a high output (in other words, either data signal SIG or data signal SIGN is a digital one).

Switches 222A, 222B, 224A, 224B, 226A, 226B, 228A, and 228B are transistors that include a gate (G) interposed by a source (S) and a drain (D), such as field effect transistors (FETs). Switch 222A is coupled to a terminal of capacitor $C_{X3A}$ (which is also coupled to a Node X) and control voltage $V_{CTL}$; and switch 222B is coupled to a terminal of capacitor $C_{X3B}$ (which is also coupled to a Node XB) and control voltage $V_{CTL}$. Both switch 222A and switch 222B are driven by complementary level-shifted output clock $\phi_{2S}$, which is generated by clock level shifter 210, such that switch 222A and switch 222B transition to an on state when complementary level-shifted output clock $\phi_{2S}$ is in a high state. Switch 224A has a gate coupled to node X, a drain coupled to differential output OUT+, and a source coupled to node N3; and switch 224B has a gate coupled to node XB, a drain coupled to differential output OUT−, and a source coupled to node N3. Switch 226A has a gate coupled to control voltage $V_{CTL}$ a source coupled to NAND gate 220A, and a drain coupled to node X; and switch 226B has a gate coupled to control voltage $V_{CTL}$ a source coupled to NAND gate 220B, and a drain coupled to node X. Switch 228A has a gate coupled to NAND gate 220A, a source coupled to ground, and a drain coupled to an output node O (which is coupled to differential output OUT+); and switch 228B has a gate coupled to NAND gage 220B, a source coupled to ground, and a drain coupled to an output node OB (which is coupled to differential output OUT−). In the depicted embodiment, switch 222A and switch 222B are NMOS transistors, switch 224A and switch 224B are PMOS transistors, switch 226A and switch 226B are NMOS transistors, and switch 228A and switch 228B are NMOS transistors, though the present disclosure contemplates various configurations.

In operation, when switch 222A and switch 222B are in an on state, capacitor $C_{X3A}$ and capacitor $C_{X3B}$ are charged to control voltage $V_{CTL}$ such that node X and node XB are respectively initialized to control voltage $C_{X1}$ Clock level shifter 210 drives voltages for operating switch 224A and switch 224B, particularly a voltage seen at node X and a voltage seen at node N3. In the depicted embodiment, a clock phase of input clock signal CLK drives the voltage seen at node X and node N3 from control voltage $V_{CTL}$ to a high voltage $V_{HI}$ (where $V_{HI}$=control voltage $V_{CTL}$=ΔV). When a same voltage is applied to sources and gates of switch 224A and switch 224B, switch 224A and switch 224B remain in an off state, holding a voltage seen by the load to 0 V. Switch 224A and switch 224B are source driven, such that switch 224A and switch 224B respectively conduct charge to load capacitor $C_{LOAD}$ and load capacitor $C_{LOAD2}$ when a voltage applied to the source rises above a voltage applied to the gate. In various implementations, a voltage applied to gates of switch 224A and switch 224B changes when its respective NAND gate (NAND gate 220A or NAND gate 220B) transitions to a low state, causing node X to transition to a low state. When in an on state, switch 224A conducts charge from node N3 to load capacitor $C_{LOAD1}$, where node N3 represents level-shifted output clock $\phi_{1S}$, thus providing output signal $V_{OUT}$ in a boosted state. Similarly, in an on state, switch 224B conducts charge from node N3 to load capacitor $C_{LOAD2}$, thus providing output signal $V_{OUTN}$ in a boosted state. Note that both switch 224A and switch 224B conduct charge from charge capacitor $C_q$. Switch 226A and switch 226B are also source driven, such that switch 226A pulls some voltage ($\Delta V_{dn}$) when in an on state, causing the voltage applied to the gate of switch 224A to drop below the voltage applied to the source of switch 224A, and switch 226B pulls some voltage ($\Delta V_{dn}$) when in an on state, causing the voltage applied to the gate of switch 224B to drop below the voltage applied to the source of switch 224B. Further, since switch 228A and switch 228B remain off until its respective NAND gate 220A and NAND gate 220B transitions to a low state, switch 228A and switch 228B can respectively keep output node O and output node OB in a low state, and thus keeping output signal $V_{OUT}$ and output signal $V_{OUTN}$ set to the low state (such as 0 V) when neither gate decision is in a low state. In various implementations, if flash ADC 34 outputs data signal SIG or data signal SIGN in a high state (1), switched capacitor logic controller 212 will steer level-shifted output clock $\phi_{1S}$ to MDAC 36, such that corresponding MDAC switches transition to an on state. If neither data signal transitions to the high state, then no level-shifted signals (and thus no level-shifted voltages) are connected to MDAC 36, such that MDAC switches remain in the off state.

Figure 5:
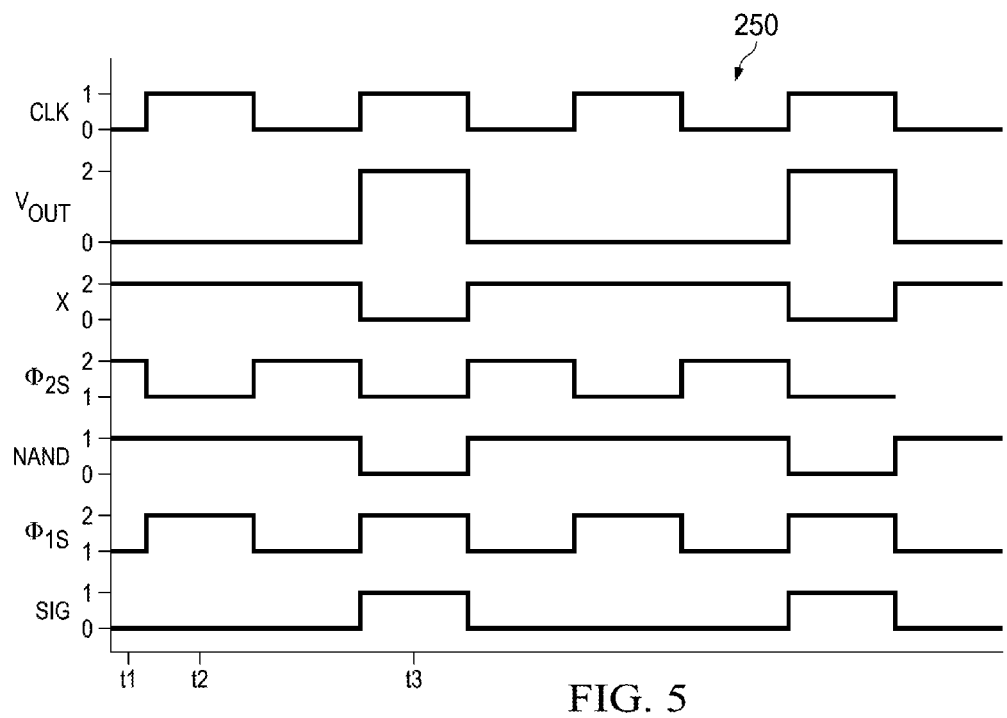
FIG. 5 is an exemplary timing diagram for the level shifter of FIG. 4 according to various aspects of the present disclosure.

FIG. 5 is an exemplary timing diagram 250 associated with operation of level shifter 200 according to various aspects of the present disclosure. Here, timing diagram 250 is associated with switched capacitor logic controller portion 205A, where clock level shifter 210 generates charge for the load, such as load capacitor $C_{LOAD1}$, and switched capacitor logic controller 212 steers the charge to load capacitor $C_{LOAD1}$. In a simplistic example, for purposes of the following discussion, a signal having a voltage level of 0 V is represented by 0, a voltage level of control voltage $V_{CTL}$ is represented by 1, and a voltage level of high voltage $V_{HI}$ ($V_{HI}$=control voltage $V_{CTL}+\Delta V$) is represented by 2.

At time t1, input clock signal CLK is in a low state (0). Accordingly, clock level shifter 210 generates level shifted output clock $\phi_{1S}$ in a low state (1) and complementary level-shifted output clock $\phi_{2S}$ in a high state (2). Complementary level-shifted output clock $\phi_{2S}$ transitions switch 222A to an on state, charging capacitor $C_{X3A}$ to control voltage $V_{CTL}$, thus initializing node X at a low state, such as control voltage $V_{CTL}$. Node N3 is also initialized (set) to the low state, such as control voltage $V_{CTL}$ by level shifted output clock $\phi_{1S}$ in the low state. Since node X and node N3 are in a low state, a same voltage is applied to the gate and source of switch 224A, keeping switch 224A in an off state, such that output signal $V_{OUT}$ is in a low state (0). Further, NAND gate 220A generates logic gate signal NAND in a high state (1), where data signal SIG is in a low state (0) and input CLK is in the low state (0). Switch 226A remains off since a voltage applied to its gate (control voltage $V_{CTL}$) is the same as a voltage applied to its source (for example, logic gate signal NAND's high state corresponds with control voltage $V_{CTL}$), ensuring that node X remains in the low state. Switch 228A also remains in an off state, keeping node O in the low state.

At time t2, input clock signal CLK is in a high state (1), and clock level shifter 210 generates level-shifted output clock $\phi_{1S}$ in a high state (2) and complementary level-shifted output clock $\phi_{2S}$ in a low state (1), transitioning switch 222A to an off state. Capacitor $C_{X3A}$ can generate an up-shifted input clock signal CLK for charging node X to a high state (for example, $V_{HI}=V_{CTL}+\Delta V$), and charge capacitor $C_q$ generates level-shifted output clock $\phi_{1S}$ for charging node N3 to the high state. Since node X and node N3 are both in the high state, a same voltage is still applied to the gate and source of switch 224A, keeping switch 224A in an off state, such that output signal $V_{OUT}$ remains in the low state (0). Further, NAND gate 220A generates logic gate signal NAND in a high state (1), where data signal SIG is in a low state (0) and input CLK is in the high state (1). Switch 226A remains off since the voltage applied to its gate is still the same as the voltage applied to its source, ensuring that node X remains in the low state. Switch 228A also remains in an off state, keeping node O in the low state.

At time t3, input clock signal CLK is again in a high state (1), and clock level shifter 210 generates level-shifted output clock $\phi_{1S}$ in a high state (2) and complementary level-shifted output clock $\phi_{2S}$ in a low state (1), transitioning switch 222A to an off state. Capacitor $C_{X3A}$ generates the up-shifted input clock signal CLK for charging node X to a high state (for example, $V_{HI}=V_{CTL}+\Delta V$), and charge capacitor $C_q$ generates level-shifted output clock $\phi_{1S}$ for charging node N3 to the high state. In contrast to time t2, at time t3, NAND gate 220A generates logic gate signal NAND in a low state (0), where data signal SIG is in a high state (1) and input CLK is in the high state (1). Switch 226A thus transitions on since the voltage applied to its gate (for example, control voltage $V_{CTL}$) is now different than the voltage applied to its source (for example, logic gate signal NAND's low state corresponds with 0 V), pulling node X to the low state (0) and transitioning switch 224A to an on state (since a voltage seen by the source at node N3 ($V_{HI}$=control voltage $V_{CTL}+\Delta V$) is now greater than the voltage seen by the gate at node X (control voltage $V_{CTL}$)). Switch 224A then pulls the level-shifted clock signal $\phi_{1S}$ at node N3 to output node O, providing logic output signal $V_{OUT}$ in a boosted state, a high voltage $V_{HI}$ (represented as a 2 in FIG. 5). Switch 228A also transitions to an on state. In level shifter 200, NAND gate 220A and NAND gate 220B thus discharge node X and node XB respectively when data signal SIG or data signal SIG is in a high state, steering the boosted output at node N3. In various implementations, boosted logic output signal $V_{OUT}$ exhibits signal levels that can sufficiently drive the load, such as MDAC 36. It is understood that switched capacitor logic controller portion 212B operates similarly, noting that only switched capacitor logic controller portion 212A or switched capacitor logic controller portion 212B will provide boosted signal levels at any one time. FIG. 5 has been simplified for the sake of clarity to better understand the inventive concepts of the present disclosure. Additional features can be added in timing diagram 250, and some of the features described can be replaced or eliminated in other embodiments of timing diagram 250.

Figure 6:
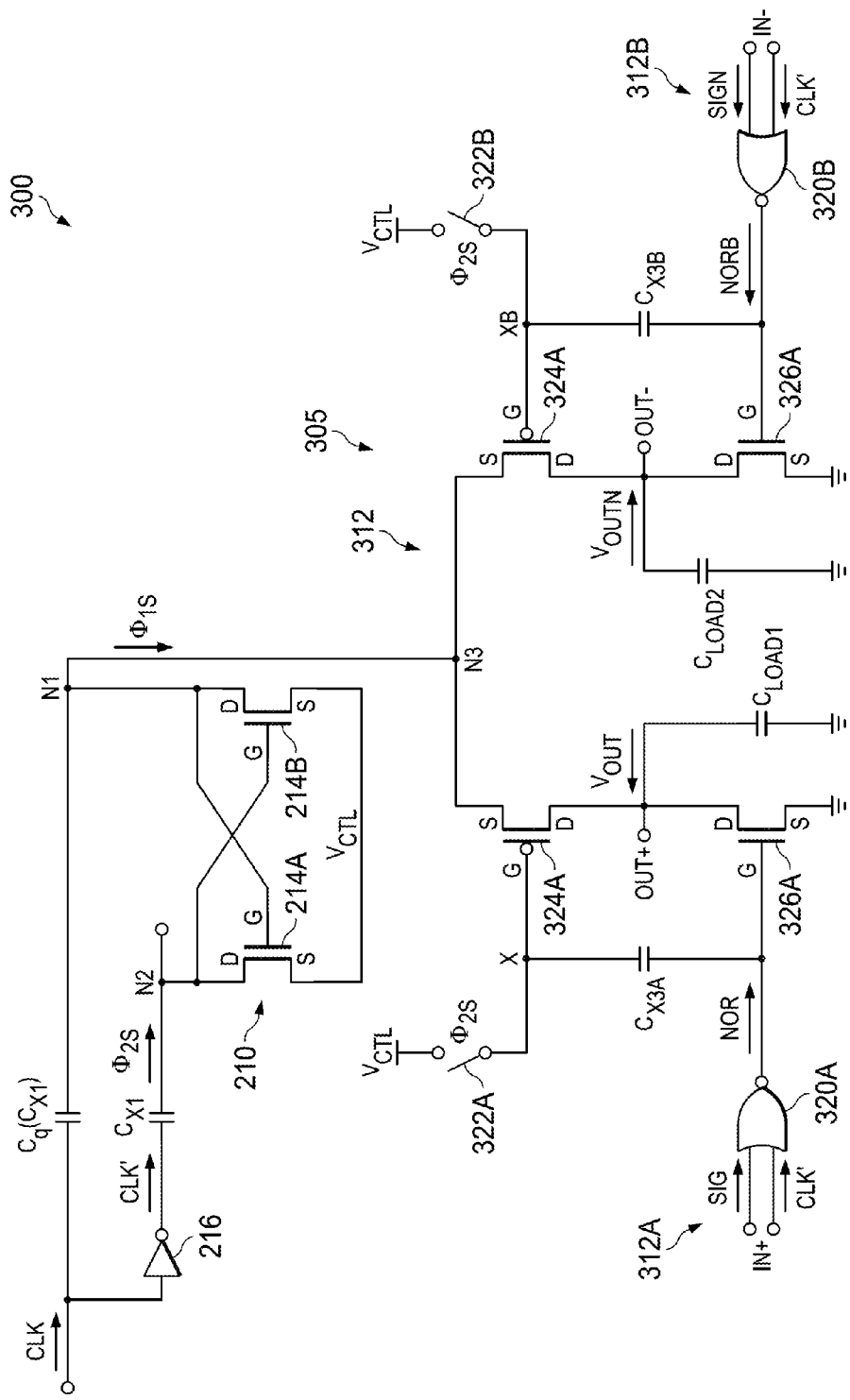
FIG. 6 is a schematic circuit diagram of yet another exemplary level shifter according to various aspects of the present disclosure.

FIG. 6 is a schematic circuit diagram of an exemplary level shifter 300 according to various aspects of the present disclosure. Level shifter 300 is an electronic device (including an electronic circuit and/or one or more electronic components) that shifts a signal from one voltage level to another voltage level. In various implementations, level shifter 300 can connect one digital circuit that uses one logic level to another digital circuit that uses another logic level. For purposes of the following discussion, level shifter 300 can be implemented in pipeline ADC 10, for example in Stage 1, as booster 40 at an interface of flash ADC 34 and MDAC 36. The embodiment of FIG. 6 is similar in many respects to the embodiment of FIG. 4. Accordingly, similar features in FIG. 4 and FIG. 6 are identified by the same reference numerals for clarity and simplicity. FIG. 6 has been simplified for the sake of clarity to better understand the inventive concepts of the present disclosure. Additional features can be added in level shifter 300, and some of the features described can be replaced or eliminated in other embodiments of level shifter 300.

Level shifter 300 includes a booster 305 having differential inputs (such as IN+ and IN−) arranged to receive differential input signals and differential outputs (such as OUT+ and OUT−) arranged to provide differential output signals. In the depicted embodiment, booster 305 is configured to receive a data signal SIG and a data signal SIGN and generate a digital output signal $V_{OUT}$ and a digital output signal $V_{OUTN}$. Data signal SIG and data signal SIGN can transition between a low voltage level represented by a digital 0 and a high voltage level represented by a digital 1. In various implementations, booster 305 boosts data signal SIG and data signal SIGN from flash ADC 34 (for example, from a latched comparator of flash ADC 34) sufficiently for driving MDAC 36, represented by output signal $V_{OUT}$ and output signal $V_{OUTN}$. Output signal $V_{OUT}$ and output signal $V_{OUTN}$ transition between a low voltage level (such as 0 V) and a high voltage level ($V_{HI}$) that is greater than control voltage $V_{HI}=V_{CTL}+\Delta V$). Level shifter 300 can include more than one booster 305, such that a booster is provided for boosting signals associated with each bit of a digital signal received from flash ADC 34, such as bits b0, b1, ... through bn-1.

Booster 305 can also boost data signals (for example, digital signals received from flash ADC 34) by implementing clock level shifter 210 and a switched capacitor logic controller 312. In FIG. 6, in contrast to level shifter 100 and similar to level shifter 200, booster 305 uses a level shifted clock signal for charging the load, instead of a level shifted data signal. More specifically, clock level shifter 210 generates a level-shifted clock signal for delivering charge to the load, and switched capacitor logic controller 312 steers the level-shifted clock signal appropriately. The switched capacitor logic controller 312 (data path) thus drives a fraction of the load, such that it can be much smaller, consuming less power and less area and further simplifying a data signal chain. Such configuration can also minimize propagation delay while using a supply voltage less than or equal to the core supply voltage.

Level shifter 300 implements clock level shifter 210 as configured and operated as described above with reference to level shifter 200 depicted in FIG. 4. For example, in operation, clock level shifter 210 drives (charges) a load, represented by load capacitor $C_{LOAD1}$ and load capacitor $C_{LOAD2}$. In the depicted embodiment, capacitor $C_{X1}$ serves as a charge capacitor $C_q$ for charging both load capacitor $C_{LOAD1}$ and load capacitor $C_{LOAD2}$, where charge capacitor $C_q$ provides level-shifted output clock $\phi_{1S}$ for charging the load. Node N3 thus represents a level-shifted version of input clock signal CLK. In furtherance of the depicted embodiment, complementary level-shifted output clock $\phi_{2S}$, generated from complementary input clock signal CLK', can be used to drive switch circuitry of switch capacitor logic controller 312. Switch 214A and switch 214B can be activated in an alternating manner for charging charge capacitor $C_q$ and capacitor $C_{X2}$, such that level-shifted output clock $\phi_{1S}$ and complementary level-shifted output clock $\phi_{2S}$ can transition from the output clock domain's low voltage level (such as $V_{CTL}$) to the output clock domain's high voltage level (such as $V_{HI}=V_{CTL}+\Delta V$). Capacitor sizes for capacitor $C_{X1}$ and capacitor $C_{X2}$ may be adjusted according to operating requirements for clock level shifter 210, switched capacitor logic controller 312, and/or level shifter 300, such as desired output clock voltage domain levels.

Switched capacitor logic controller 312 steers (pulls) level-shifted output clock $\phi_{1S}$ to appropriately charge load capacitor $C_{LOAD1}$ and load capacitor $C_{LOAD2}$. In level shifter 300, switched capacitor logic controller 312 implements a NOR logic gate and switch circuitry for steering level-shifted output clock $\phi_{1S}$. For example, in the depicted embodiment, a switched capacitor logic controller portion 312A includes capacitor $C_{X3A}$, a NOR gate 320A, and switch circuitry (a switch 322A, a switch 324A, and a switch 326A); and a switched capacitor logic controller portion 312B includes capacitor $C_{X3B}$, a NOR gate 320B, and switch circuitry (a switch 322B, a switch 324B, and a switch 326B). NOR gate 320A and NOR gate 320B generate logic gate signals, a logic gate signal NOR and a logic gate signal NORB, for respectively steering level-shifted output clock $\phi_{1S}$ for charging the load—here, load capacitor $C_{LOAD1}$ and load capacitor $C_{LOAD2}$. In contrast to level shifter 200, level shifter 300 uses complementary input clock signal CLK' of clock level shifter 210 for gating decisions of switched capacitor logic controller 312, where active falling edges of NOR gate 320A and NOR gate 320B provide logic gate signals for controlling the switch circuitry that steers charge associated with level-shifted output clock $\phi_{1S}$ to load capacitor $C_{LOAD1}$ and load capacitor $C_{LOAD2}$. As noted above, a latched comparator of flash ADC 34 can provide data signal SIG and data signal SIGN to booster 305, where the various output states for data signal SIG and data signal SIGN are depicted in Table 1 above. In the depicted embodiment, NOR gate 320A receives data signal SIG and complementary input clock signal CLK', and compares data signal SIG with complementary input clock signal CLK' to generate logic gate signal NOR. Similarly, NOR gate 320B receives data signal SIGN and complementary input clock signal CLK', and compares data signal SIGN with complementary input clock signal CLK' to generate logic gate signal NORB. In various implementations, NOR gate 320A outputs logic gate signal NOR in a high state when data signal SIG and complementary input clock signal CLK' are both in a low state, and outputs logic gate signal NOR in a low state otherwise; and NOR gate 320B outputs logic gate signal NORB in a high state when data signal SIGN and complementary input clock signal CLK' are both in a low state, and outputs logic gate signal NORB in a low state otherwise. For example, logic gate signal NOR and logic gate signal NORB can transition between a low voltage represented by a digital zero and a high voltage represented by a digital one. Table 6 depicts possible inputs and associated outputs for NOR gate 320A, and Table 7 depicts possible inputs and associated outputs for NOR gate 320B.

TABLE 6

NOR Gate 312A Inputs/Output

| SIG | CLK' | NOR |
|---|---|---|
| 1 | 0 | 0 |
| 0 | 1 | 0 |
| 0 | 0 | 1 |
| 1 | 1 | 0 |

TABLE 7

NOR Gate 312B Inputs/Output

| SIGN | CLK' | NORB |
|---|---|---|
| 1 | 0 | 0 |
| 0 | 1 | 0 |
| 0 | 0 | 1 |
| 1 | 1 | 0 |

Accordingly, one of NOR gate 320A and NOR gate 320B will output a logic gate signal in a high state. Since switched capacitor logic controller 312 exhibits a one-hot type output (result), meaning that either NOR gate 320A or NOR gate 320B will be driven to a high state, level shifter 300 can implement a single charge capacitor—charge capacitor $C_q$—for delivering charge to load capacitor $C_{LOAD1}$ or load capacitor $C_{LOAD2}$ when flash ADC 34 generates a low output (in other words, either data signal SIG or data signal SIGN is a digital one).

Switches 322A, 322B, 324A, 324B, 326A, and 326B are transistors that include a gate (G) interposed by a source (S) and a drain (D), such as field effect transistors (FETs).

Switch 322A is coupled to a terminal of capacitor $C_{X3A}$ (which is also coupled to a node X) and control voltage $V_{CTL}$; and switch 322B is coupled to a terminal of capacitor $C_{X3B}$ (which is also coupled to a node XB) and control voltage $V_{CTL}$. Both switch 322A and switch 322B are driven by complementary level-shifted output clock $\phi_{2S}$, which is generated by clock level shifter 210, such that switch 322A and switch 322B transition to an on state when complementary level-shifted output clock $\phi_{2S}$ is in a high state. Capacitor $C_{X3A}$ has a terminal coupled to NOR gate 320A and another terminal coupled to switch 322A, such that capacitor $C_{X3A}$ can provide and up-shifted version of logic gate signal NOR at node X, depending on a phase of complementary input clock signal CLK' and data signal SIG. Capacitor $C_{X3B}$ has a terminal coupled to NOR gate 320B and another terminal coupled to switch 322B, such that capacitor $C_{X3B}$ can provide and up-shifted version of logic gate signal NORB at node XB, depending on a phase of complementary input clock signal CLK' and data signal SIGN. Switch 324A has a gate coupled to node X, a drain coupled to differential output OUT+, and a source coupled to node N3; and switch 324B has a gate coupled to node XB, a drain coupled to differential output OUT−, and a source coupled to node N3. Switch 326A has a gate coupled to NOR gate 320A, a source coupled to ground, and a drain coupled to an output node O (which is coupled to differential output OUT+); and switch 326B has a gate coupled to NOR gate 320B, a source coupled to ground, and a drain coupled to an output node OB (which is coupled to differential output OUT−). In the depicted embodiment, switch 322A and switch 322B are NMOS transistors, switch 324A and switch 324B are PMOS transistors, and switch 326A and switch 326B are NMOS transistors, though the present disclosure contemplates various configurations.

In operation, when switch 322A and switch 322B are in an on state, capacitor $C_{X3A}$ and capacitor $C_{X3B}$ are charged to control voltage $V_{CTL}$ such that node X and node XB are also respectively initialized to control voltage $V_{CTL}$. Clock level shifter 210 drives voltages for operating switch 324A and switch 324B, particularly a voltage seen at node N3. In the depicted embodiment, a clock phase of input clock signal CLK drives the voltage seen at node N3 from control voltage $V_{CTL}$ to a high voltage $V_{HI}$ (where $V_{HI}$=control voltage $V_{CTL}+\Delta V$). When a same voltage is applied to sources and gates of switch 324A and switch 324B, switch 324A and switch 324B remain in an off state, holding a voltage seen by the load to 0 V. Switch 324A and switch 324B are source driven, such that switch 324A and switch 324B respectively conduct charge to load capacitor $C_{LOAD1}$ and load capacitor $C_{LOAD2}$ when a voltage applied to the source rises above a voltage applied to the gate. In various implementations, a voltage applied to gates of switch 324A and switch 324B changes when its respective NOR gate (NOR gate 320A or NOR gate 320B) transitions to a high state, causing node X to transition to a low state. When in an on state, switch 324A conducts charge from node N3 to load capacitor $C_{LOAD}$ where node N3 represents level-shifted output clock $\phi_{1S}$, thus providing output signal $V_{OUT}$ in a boosted state. Similarly, in an on state, switch 324B conducts charge from node N3 to load capacitor $C_{LOAD2}$, thus providing output signal $V_{OUTN}$ in a boosted state. Note that both switch 324A and switch 324B conduct charge from charge capacitor $C_q$. Since switch 326A and switch 326B remain off until its respective NOR gate 320A and NOR gate 320B transitions to a high state, switch 326A and switch 326B can respectively keep output node O and output node OB in a low state, and thus keep output signal $V_{OUT}$ and output signal $V_{OUTN}$ set to the low state (such as 0 V) when neither gate decision is in a high state. In various implementations, if flash ADC 34 outputs data signal SIG or data signal SIGN in a low state (0) while complementary input clock signal CLK' is also in a low state (0), switched capacitor logic controller 312 will steer level-shifted output clock $\phi_{1S}$ to MDAC 36, such that corresponding MDAC switches can transition to an on state. If neither data signal SIG or data signal SIGN transitions to the low state, then no level-shifted signals (and thus no level-shifted voltages) are connected to MDAC 36, such that MDAC switches remain in the off state.

Figure 7:
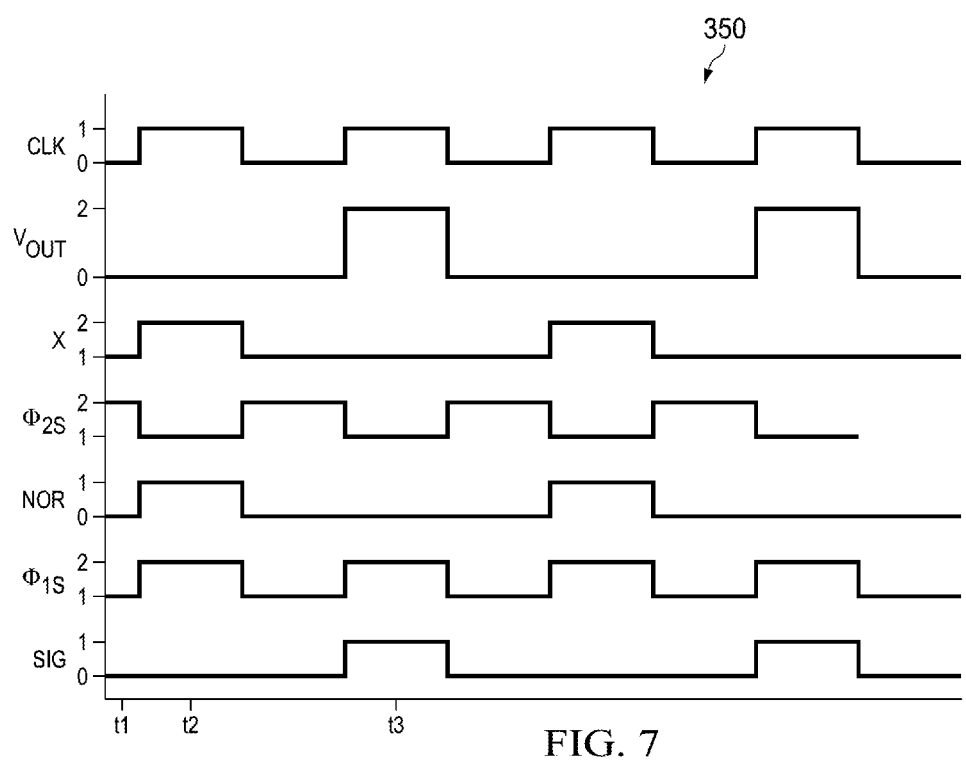
FIG. 7 is an exemplary timing diagram for the level shifter of FIG. 6 according to various aspects of the present disclosure.

FIG. 7 is an exemplary timing diagram 350 associated with operation of level shifter 300 according to various aspects of the present disclosure. Here, timing diagram 350 is associated with switched capacitor logic controller portion 312A, where clock level shifter 210 generates charge for the load, such as load capacitor $C_{LOAD}$ and switched capacitor logic controller 312 steers the charge to load capacitor $C_{LOAD}$. In a simplistic example, for purposes of the following discussion, a signal having a voltage level of 0 V is represented by 0, a voltage level of control voltage $V_{CTL}$ is represented by 1, and a voltage level of high voltage $V_{HI}$ ($V_{HI}$=control voltage $V_{CTL}+\Delta V$) is represented by 2.

At time t1, input clock signal CLK is in a low state (0), and complementary input clock signal CLK' is in a high state (1). Accordingly, clock level shifter 210 generates level-shifted output clock $\phi_{1S}$ in a low state (1) and complementary level-shifted output clock $\phi_{2S}$ in a high state (2). Complementary level-shifted output clock $\phi_{2S}$ transitions switch 322A to an on state, charging capacitor $C_{X3A}$ to control voltage $V_{CTL}$. Further, since data signal SIG is in a low state (0) and complementary input clock signal CLK' is in the high state, NOR gate 320A generates logic gate signal NOR in a low state (0). Node N3 and node X are thus initialized (set) to a low state, such as control voltage $V_{CTL}$. Since node X and node N3 are in a low state, a same voltage is applied to the gate and source of switch 324A, keeping switch 324A in an off state, such that output signal $V_{OUT}$ is in a low state (0). Switch 326A also remains in an off state, keeping node O in the low state.

At time t2, input clock signal CLK is in a high state (1), and complementary input clock signal CLK' is in a low state (0). Accordingly, clock level shifter 210 generates level-shifted output clock $\phi_{1S}$ in a high state (2) and complementary level-shifted output clock $\phi_{2S}$ in a low state (1), transitioning switch 322A to an off state. Further, since data signal SIG is in a low state (0) and complementary input clock signal CLK' is in the low state, NOR gate 320A generates logic gate signal NOR in a high state (1). Capacitor $C_{X3A}$ can generate an up-shifted logic gate signal NOR for charging node X to a high state (for example, $V_{HI}$=$V_{CTL}+\Delta V$), and charge capacitor $C_q$ generates level-shifted output clock $\phi_{1S}$ for charging node N3 to the high state. Since node X and node N3 are both in the high state, a same voltage is still applied to the gate and source of switch 324A, keeping switch 324A in an off state, such that output signal $V_{OUT}$ remains in the low state (0). Switch 326A transitions to an on state, keeping node O in the low state.

At time t3, input clock signal CLK is again in a high state (1), and complementary input clock signal CLK' is in a low state (0). Accordingly, clock level shifter 210 generates level-shifted output clock $\phi_{1S}$ in a high state (2) and complementary level-shifted output clock $\phi_{2S}$ in a low state (1), transitioning switch 322A to an off state. Further, since data signal SIG is in a high state (1) and complementary input clock signal CLK' is in the low state, NOR gate 320A generates logic gate signal NOR in a low state (0), which pulls node X from the high state ($V_{HI}$=control voltage $V_{CTL}+\Delta V$) to the low state (control voltage $V_{CTL}$). Since a voltage seen by the source at node N3 ($V_{HI}$=control voltage $V_{CTL}+\Delta V$) is now greater than the voltage seen by the gate at node X (control voltage $V_{CTL}$), switch 324A transitions to an on state, pulling the level-shifted clock signal $\phi_{1S}$ at node N3 to output node 0, providing logic output signal $V_{OUT}$ in a boosted state, a high voltage $V_{HI}$ (represented as a 2 in FIG. 7). Switch 326A remains in an off state. Accordingly, in level shifter 300, on falling edges of complementary input clock signal CLK', NOR gate 320A and NOR gate 320B respectively keep switch 324A and switch 324B in an off state until one of data signal SIG or data signal SIGN are in a high state, enabling a gate of the respective switch 324A or switch 324B. NOR gate 320A and NOR gate 320B thus serve a dual purpose of respectively boosting node X and node XB, as well as steering boosted output at node N3 with a data decision by discharging node X and node XB respectively. In various implementations, boosted logic output signal $V_{OUT}$ exhibits signal levels that can sufficiently drive the load, such as MDAC 36. It is understood that switched capacitor logic controller portion 312B operates similarly, noting that only switched capacitor logic controller portion 312A or switched capacitor logic controller portion 312B will provide boosted signal levels at any one time. FIG. 7 has been simplified for the sake of clarity to better understand the inventive concepts of the present disclosure. Additional features can be added in timing diagram 350, and some of the features described can be replaced or eliminated in other embodiments of timing diagram 350.

In various implementations, level shifters (for example, level shifter 100, level shifter 200, and level shifter 300) systems for implementing the level shifters (for example, pipeline ADC 10), and/or the various circuits and/or components of the FIGURES can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself. In various implementations, level shifters (for example, level shifter 100, level shifter 200, and level shifter 300) systems for implementing the level shifters (for example, pipeline ADC 10), and/or the various circuits and/or components of the FIGURES can be implemented as stand-alone modules (for example, a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the various functions described herein may be implemented in one or more semiconductor cores (such as silicon cores) in application specific integrated circuits (ASICs), field programmable gate arrays (FPGAs), other semiconductor chips, or combinations thereof.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense. Further the various circuitry configurations described above can be replaced, substituted, or otherwise modified to accommodate various design implementations that achieve the lock detection mechanisms described herein. Moreover, using complementary electronic devices, hardware, software, etc. can offer an equally viable option for implementing the teachings of the present disclosure.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for generating a level shifted clock signal, and means for steering the level shifted clock signal based on the data signal and the input clock signal to provide a level shifted version of the data signal. The 'means for' can also or alternatively include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein. In various implementations, the various functions outlined herein may be implemented by logic encoded in one or more non-transitory and/or tangible media (for example, embedded logic provided in an application specific integrated circuit (ASIC), as digital signal processor (DSP) instructions, software (potentially inclusive of object code and source code) to be executed by a processor, or other similar machine, etc.).

What is claimed is:

1. A level shifter comprising:
a clock level shifter configured to up-shift an input clock signal to generate a level-shifted clock signal; and
a switched capacitor logic controller coupled to the clock level shifter at a node having the level-shifted clock signal, wherein the switched capacitor logic controller is configured to steer the level shifted clock signal based on a data signal and the input clock signal to charge a load, providing a level shifted version of the data signal.

2. The level shifter of claim 1, wherein the clock level shifter includes:
a charge capacitor having a first terminal coupled to an input node for receiving the input clock signal and a second terminal to provide the level-shifted clock signal; and
a capacitor configured to provide a complementary level shifted clock signal from a complementary input clock signal.

3. The level shifter of claim 2, wherein the switched capacitor logic controller includes:
a negated AND (NAND) gate configured to generate a NAND logic gate signal based on the data signal and the input clock signal;
a switch circuit coupled to the NAND gate and the clock level shifter, wherein the switch circuit steers the level shifted clock signal based on the NAND logic gate signal; and
a capacitor coupled to the clock level shifter and the switch circuit, wherein the capacitor is configured to provide another level shifted input clock signal.

4. The level shifter of claim 3, wherein the switch circuit includes:
a first switch having a gate coupled to a control voltage, a source coupled to the NAND gate, and a drain coupled to a first node charged by the another level shifted input clock signal;
a second switch having a gate coupled to the first node, a source coupled to a second node charged by the level shifted clock signal from the clock level shifter, and a drain coupled with an output node; and
a third switch having a gate coupled to the complementary level shifted clock signal, a source coupled to the first node, and drain coupled to the control voltage; and
wherein the first switch, the second switch, and the third switch are configured such that the second switch pulls the level shifted clock signal from the second node to the output node when the first switch pulls a voltage level down at the first node.

5. The level shifter of claim 4, wherein the second switch is a p-type metal-oxide-semiconductor transistor and the first switch and the third switch are n-type metal-oxide-semiconductor transistors.

6. The level shifter of claim 2, wherein the switched capacitor logic controller includes:
a NOR gate that generates a NOR logic gate signal based on the data signal and the complementary input clock signal;
a switch circuit coupled to the NOR gate and the clock level shifter, wherein the switch circuit steers the level shifted clock signal based on the NOR logic gate signal; and
a capacitor coupled to the NOR gate and the switch circuit, wherein the capacitor is configured to generate a level-shifted NOR logic gate signal.

7. The level shifter of claim 6, wherein the switch circuit includes:
a first switch having a gate coupled to a first node charged by the level-shifted NOR logic gate signal, a source coupled with a second node charged by the level shifted clock signal from the clock level shifter, and a drain coupled with an output node;
a second switch having a gate coupled with the complementary level shifted clock signal, a source coupled with the first node, and a drain coupled with a control voltage; and
wherein the first switch is configured to pull the level shifted clock signal to the output node when the NOR gate pulls a voltage level down at the first node.

8. The level shifter of claim 7, wherein the first switch is a p-type metal-oxide-semiconductor transistor and the second switch is an n-type metal-oxide-semiconductor transistor.

9. The level shifter of claim 1, wherein a single charge capacitor is used to charge a differential capacitive load, the differential capacitive load being the load.

10. The level shifter of claim 1, wherein the clock level shifter and the switched capacitor logic controller are configured to generate the level shifted version of the data signal operating solely on a core supply voltage.

11. A method for shifting a signal from a first voltage domain to a second voltage domain, the method comprising:
up-shifting an input clock signal to generate a level shifted clock signal; and
steering a charge associated with the level shifted clock signal based on a data signal and the input clock signal to a load to provide a level shifted version of the data signal.

12. The method of claim 11, wherein the steering the level shifted clock signal includes generating a logic gate signal based on the data signal and the input clock signal, wherein the logic gate signal drives a switch circuit for steering the level shifted clock signal.

13. The method of claim 12, wherein the logic gate signal has a low state and a high state, and further wherein steering the level shifted clock signal includes outputting the level shifted version of the data signal when the logic gate signal is in the low state.

14. The method of claim 12, wherein the switch circuit includes a switch, the method further comprising:
applying the level shifted clock signal to a first node coupled with a gate of the switch and a second node coupled with a source of the switch; and
pulling a voltage level down at the first node when the logic gate signal is in a low state and the input clock signal is in a high state, such that the switch conducts the level shifted clock signal at the second node to a load.

15. The method of claim 11, wherein the steering the level shifted clock signal includes generating a logic gate signal based on the data signal and a complementary input clock signal, wherein the logic gate signal drives a switch circuit for steering the level shifted clock signal.

16. The method of claim 15, wherein the logic gate signal has a low state and a high state, and further wherein steering the level shifted clock signal includes outputting the level shifted version of the data signal when the logic gate signal is in the low state.

17. The method of claim 15, wherein the switch circuit includes a switch, the method further comprising:
applying a level shifted logic gate signal to a first node coupled with a gate of a switch of the switch circuit;
applying the level shifted clock signal to a second node coupled with a source of the switch; and
pulling a voltage level down at the first node when the logic gate signal is in a low state and the input clock signal is in a high state, such that the switch conducts the level shifted clock signal at the second node to a load.

18. A system for shifting a data signal from a first voltage domain to a second voltage domain, the system comprising:
means for generating a level shifted clock signal representing an up-shifted version of an input clock signal; and
means for steering the level shifted clock signal based on a data signal and the input clock signal to charge a load and provide a level shifted version of the data signal.

19. The system of claim 18, wherein the means for steering the level shifted clock signal includes:
means for applying the level shifted clock signal to a gate and a source of a switch; and
means for pulling a voltage down at the gate, such that the switch pulls the level shifted clock signal from the source to the load.

20. The system of claim 18, wherein the means for steering the level shifted clock signal includes:
means for applying a level shifted logic gate signal to a gate of a switch;
means for applying the level shifted clock signal to a source of the switch; and
means for pulling a voltage down at the gate, such that the switch pulls the level shifted clock signal from the source to the load.

* * * * *